(12) United States Patent
Leatherdale et al.

(10) Patent No.: US 7,232,650 B2
(45) Date of Patent: Jun. 19, 2007

(54) PLANAR INORGANIC DEVICE

(75) Inventors: Catherine A. Leatherdale, St. Paul, MN (US); Craig R. Schardt, St. Paul, MN (US); D. Scott Thompson, Woodbury, MN (US); Wendy L. Thompson, Roseville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 199 days.

(21) Appl. No.: 10/263,131

(22) Filed: Oct. 2, 2002

(65) Prior Publication Data

US 2004/0067450 A1 Apr. 8, 2004

(51) Int. Cl.
*G03F 7/30* (2006.01)
*G03F 7/027* (2006.01)

(52) U.S. Cl. ............ 430/321; 430/281.1; 430/288.1; 430/330; 432/13; 385/129

(58) Field of Classification Search ............. 430/321, 430/330, 281.1, 288.1, 280.1, 325; 432/13; 385/129
See application file for complete search history.

(56) References Cited

U.S. PATENT DOCUMENTS

| | | | |
|---|---|---|---|
| 2,801,185 A | 7/1957 | Iler | |
| 3,018,262 A | 1/1962 | Schroeder | |
| 3,117,099 A | 1/1964 | Proops et al. | |
| 3,502,520 A | 3/1970 | Schwartz | |
| 3,583,931 A * | 6/1971 | Bouchard | 252/519.13 |
| 3,729,313 A | 4/1973 | Smith | |
| 3,741,769 A | 6/1973 | Smith | |
| 3,779,778 A | 12/1973 | Smith | |
| 3,808,006 A | 4/1974 | Smith | |
| 3,954,475 A | 5/1976 | Bonham et al. | |
| 3,987,037 A | 10/1976 | Bonham et al. | |
| 4,250,053 A | 2/1981 | Smith | |
| 4,279,717 A | 7/1981 | Eckberg et al. | |
| 4,394,403 A | 7/1983 | Smith | |
| 4,394,433 A | 7/1983 | Gatzke | |
| 4,491,628 A | 1/1985 | Ito et al. | |
| 4,522,958 A | 6/1985 | Das et al. | |
| 4,642,126 A | 2/1987 | Zador et al. | |
| 4,652,274 A | 3/1987 | Boettcher et al. | |
| 4,735,632 A | 4/1988 | Oxman et al. | |
| 4,751,138 A | 6/1988 | Tumey et al. | |
| 4,859,572 A | 8/1989 | Farid et al. | |
| 4,963,471 A | 10/1990 | Trout et al. | |
| 4,970,135 A * | 11/1990 | Kushi et al. | 430/280.1 |
| 5,032,478 A * | 7/1991 | Nebe et al. | 430/281.1 |
| 5,032,490 A * | 7/1991 | Nebe et al. | 430/281.1 |
| 5,047,313 A * | 9/1991 | Nebe et al. | 430/281.1 |
| 5,235,015 A | 8/1993 | Ali et al. | |
| 5,238,744 A | 8/1993 | Williams et al. | |
| 5,436,279 A | 7/1995 | Grundke et al. | |
| 5,545,676 A | 8/1996 | Palazzotto et al. | |
| 5,624,782 A * | 4/1997 | Hayakawa et al. | 430/198 |
| 5,753,346 A | 5/1998 | Leir et al. | |
| 5,856,373 A | 1/1999 | Kaisaki et al. | |
| 5,998,495 A | 12/1999 | Oxman et al. | |
| 6,025,406 A | 2/2000 | Oxman et al. | |
| 6,054,007 A | 4/2000 | Boyd et al. | |
| 6,267,913 B1 | 7/2001 | Marder et al. | |
| 6,291,145 B1 | 9/2001 | Kokubo et al. | |
| 6,316,153 B1 | 11/2001 | Goodman et al. | |
| 6,455,103 B1 | 9/2002 | Mennig et al. | |
| 6,512,606 B1 | 1/2003 | Lipson et al. | |
| 6,593,392 B2 | 7/2003 | Wang | |
| 6,624,915 B1 | 9/2003 | Kirkpatrick et al. | |
| 6,656,990 B2 | 12/2003 | Shustack et al. | |
| 6,682,872 B2 | 1/2004 | Sachdev et al. | |
| 6,750,266 B2 | 6/2004 | Bentsen et al. | |
| 6,852,766 B1 | 2/2005 | DeVoe | |
| 7,005,229 B2 | 2/2006 | Nirmal et al. | |
| 7,008,749 B2 | 3/2006 | Gonsalves | |
| 2002/0001763 A1* | 1/2002 | Yasuno et al. | 430/18 |
| 2003/0019517 A1 | 1/2003 | McFarland | |

(Continued)

FOREIGN PATENT DOCUMENTS

EP  0 432 907  6/1991

(Continued)

OTHER PUBLICATIONS

Cumpston et al., Two-Photon Polymerization Initiators for Three-Dimensional Optical Data Storage and Microfabrication, *Nature*, vol. 398, Mar. 4, 1999, pp. 51-54, XP002270322.

(Continued)

*Primary Examiner*—John S. Chu
(74) *Attorney, Agent, or Firm*—H. Sanders Gwin; David R. Cleveland; Lucy C. Weiss

(57) ABSTRACT

A method for making an inorganic structure including:
(a) applying a photoreactive composition to a substrate, wherein the composition includes:
a reactive species,
a photoinitiator system, and
a plurality of substantially inorganic colloidal particles, wherein the particles have an average particle size of less than about 300 nm;
(b) photopatterning the composition to define a structure; and
(c) subjecting the structure to elevated temperature for a time sufficient to pyrolyze the reactive species and to at least partially fuse the particles.

47 Claims, 2 Drawing Sheets

U.S. PATENT DOCUMENTS

| | | |
|---|---|---|
| 2003/0139484 A1 | 7/2003 | Bentsen et al. |
| 2004/0067431 A1 | 4/2004 | Arney et al. |
| 2004/0067451 A1 | 4/2004 | DeVoe et al. |
| 2004/0068023 A1* | 4/2004 | Leatherdale et al. ............ 522/2 |
| 2004/0079195 A1 | 4/2004 | Perry et al. |

FOREIGN PATENT DOCUMENTS

| | | |
|---|---|---|
| WO | WO 98/21521 | 5/1998 |
| WO | WO 01/96409 | 12/2001 |
| WO | WO 01/96452 | 12/2001 |
| WO | WO 01/96915 | 12/2001 |
| WO | WO 01/96917 | 12/2001 |
| WO | WO 01/96952 | 12/2001 |
| WO | WO 01/96958 | 12/2001 |
| WO | WO 01/96959 | 12/2001 |
| WO | WO 01/96961 | 12/2001 |
| WO | WO 01/96962 | 12/2001 |
| WO | WO 02/079691 | 10/2002 |

OTHER PUBLICATIONS

Stellacci et al., One- and Two-Photon Induced Growth of Ligand Coated Nanoparticles for 2 & 3D Metal Patterning, *Proc. SPIE*, vol. 4809, Jul. 9, 2002, pp. 62-68, XP002270320.

Wu et al., Two-Photon Photographic Production of Three-Dimensional Metallic Structures Within A Dielectric Matrix, *Advanced Materials*, vol. 12, No. 19, Oct. 2, 2000, pp. 1438-1441, XP002270323.

Zhou et al., An Efficient Two-Photon-Generated Photoacid Applied to Positive-Tone 3D Microfabrication, *Science*, vol. 296, May 10, 2002, pp. 1106-1109, XP002270321.

R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991).

R. D Allen et al. in Proc. SPIE 2438, 474-477 (1995).

Beringer et al., J. Am. Chem. Soc. 81, 342-351 (1959).

Bull. Chem. Soc. Japan, 42, 2924-2930 (1969).

R. J. Cox, *Photographic Sensitivity*, Chapter 15, Academic Press (1973).

D. F. Eaton "Advances in Photochemistry", edited by B. Voman et al., vol. 13, pp. 427-488, John Wiley and Sons, New York (1986).

C. Xu and W. W. Webb in J. Opt. Soc. Am. B, 13, 481-491(1996).

R.A. Andrievsky, "State-of-the-art and perspectives in the field of particulate nanostructured materials," J. Mater. Sci. Technol. 14, 97 (1988).

I. B. Berlman in *Handbook of Fluorescence Spectra of Aromatic Molecules*, Second Edition, pp. 24-27, Academic Press, New York (1971).

MEMS-vol. 2, Micro-Electro-Mechanical Systems-2000 "Optically-Driven Microstructures Fabricated by Two-Photon Microstereolithography", pp. 695-699.

J. V. Morris, M. A. Mahoney, and J. R. Huber in J. Phys. Chem. 80, 969-974 (1976).

J. N. Demas and G. A. Crosby in J. Phys. Chem. 75, 991-1024 (1971).

Stellacci et al., Adv. Mater. vol. 14, No. 3, "Laser and Electron-Beam Induced Growth of Nanoparticles for 2D and 3D Metal Patterning" pp. 194-198.

U.S. Appl. No. 10/033,507, filed Dec. 28, 2001, "Multiphoton Photosensitization System".

Lakowicz et al, "Emission Spectral Properties of Cadmium sulfide Nanoparticles with Multiphoton Excitation", J. Phys. Chem. B 106 5365-5370, 2002 XP-002316823.

* cited by examiner

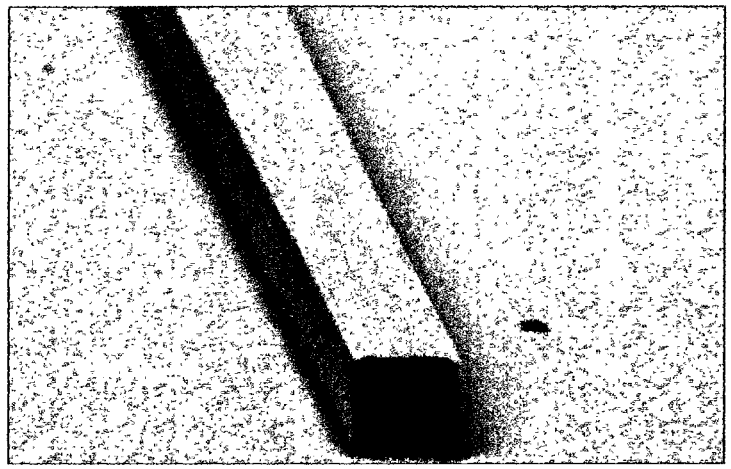
Fig. 2 — 10 μm
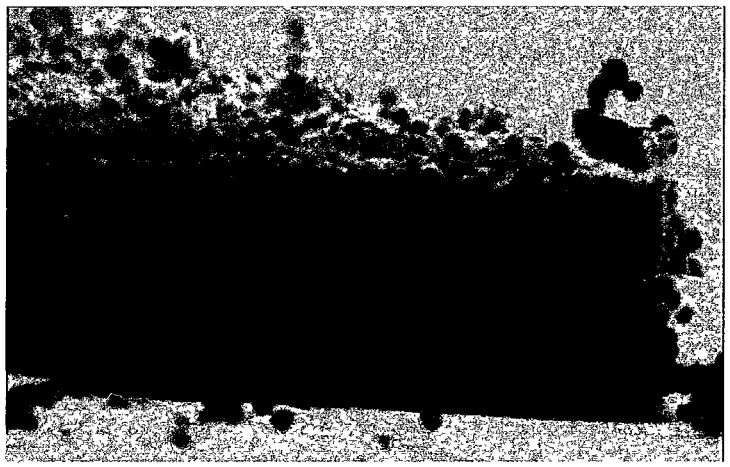
Fig. 3 — 1 μm
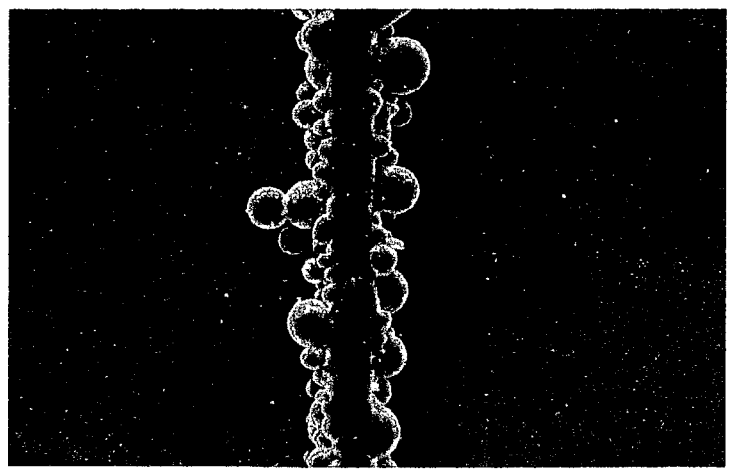
Fig. 4 — 10 μm

PLANAR INORGANIC DEVICE

TECHNICAL FIELD

This invention relates to a photocurable composition including inorganic particles and methods for fabricating structures of micron and sub-micron dimensions.

BACKGROUND

Conventional approaches for preparing inorganic microstructures such as planar optical devices (e.g., optical waveguides) involve numerous time-consuming process steps and complex, expensive capital equipment. The most common methods of making waveguides consist of depositing the waveguide layers by plasma-enhanced chemical vapor deposition (PECVD), or flame hydrolysis deposition (FHD). A typical process for waveguide fabrication begins with deposition of a low-index optical cladding layer on an optically-flat substrate. This layer can be annealed to consolidate it (FHD), or densify and stabilize it (PECVD). Next a higher-index optical core layer is deposited on top of the lower cladding layer; it is also typically annealed. To produce useful devices, this core layer must be patterned into ridges that will form the waveguides. The patterning is typically done by first depositing a thin layer of a slowly etching material on the core to act as an etch barrier. The etch barrier is then coated with photoresist, which must be subsequently soft baked, imaged via exposure to ultraviolet light in a mask aligner, chemically developed and hard baked. The photoresist image is transferred to the etch barrier via a first etch step, then transferred to the core material via a directional etching process such as reactive ion etching. Finally, the waveguide ridges are covered with a lower-index upper optical cladding layer, which can be annealed after deposition. Although excellent results can be achieved using vapor deposition and reactive ion etching techniques, the deposition and patterning processes are complex and relatively slow (the deposition and etching steps can each require several hours), and the equipment is expensive (the chemical vapor deposition (CVD) and reactive ion etching(RIE) units alone each cost several hundreds of thousands of dollars). Thus, it is difficult to manufacture very low cost devices, especially in low volume.

Sol-gel methods for waveguide fabrication potentially allow the deposition of films for waveguide fabrication without the use of FHD or PECVD, using relatively simple and inexpensive spin or dip coating equipment. Furthermore, these materials can potentially be photosensitized and directly patterned using traditional lithography, thereby eliminating many process steps and the need for RIE equipment. Unfortunately, sol-gel fabrication of high-quality layers suitable for waveguides has proven extremely challenging. This is because of the difficulty of producing uniform, crack free films having appropriate thicknesses for waveguide structures (typically on the order of 6–10 microns). This difficulty is largely due to shrinkage that occurs as sol-gel films are dried or sintered. Consequently, using sol-gel processing for fabrication of inorganic devices with dimensions suitable for good mode matching to single mode or multi-mode optical fiber can be difficult.

SUMMARY

The invention allows fabrication of inorganic structures, such as planar waveguides and splitters, using inexpensive solution processing and conventional photopatterning. The invention provides the ability to use photoimageable resins including uniformly dispersed, non-aggregated particles to form high resolution features (micron) with little resolution loss due to scattering. Addition of inorganic particles to the reactive composition allows tailoring of the optical, thermal, mechanical, and dielectric properties of the composite, while maintaining the speed, easy processing, and flexible chemistry provided by the organic components of the composition. Following imaging, the completed structure can be left as is, heated to pyrolyze the organic components and leave a substantially inorganic porous structure, or sintered further to leave a substantially inorganic densified structure.

The invention provides several advantages over other approaches for the fabrication of inorganic microstructures. First, the reactive compositions have rheological properties such that they can be formed using conventional techniques, such as spin coating, into stable, uniform films suitable for direct photopatterning rather than requiring time-consuming photoresist steps. Due in part to the viscosity characteristics of the photoreactive composition, relatively thick structures can be coated and patterned in a single step. Incorporation of sub-micron size colloidal particles into the reactive compositions allows the photolithography to be performed with little loss of resolution due to light scattering in the patterning step. Additionally, the photodefined and sintered structures are characterized by low sidewall roughness due to incorporation of submicron colloidal particles in the photoreactive compositions, which is necessary for efficient transmission of light through patterned optical waveguides. Pyrolysis of the patterned organic/inorganic hybrid waveguide yields a porous inorganic waveguide which maintains low sidewall roughness. The particles are randomly close packed resulting in internal voids which are nanometer in size. The porous waveguides can be further sintered to form dense waveguide structures. Finally, an additional benefit of this invention is that the capital equipment required is inexpensive in comparison with conventional approaches.

In one aspect, the invention provides a method for making an inorganic structure including:

(a) applying a photoreactive composition to a substrate, wherein the composition comprises:
   a reactive species,
   a photoinitiator system, and
   a plurality of substantially inorganic colloidal particles, wherein the particles have an average particle size of less than about 300 nm;

(b) photopatterning the composition to define a structure; and (c) subjecting the structure to elevated temperature for a time sufficient to pyrolyze the reactive species and to at least partially fuse the particles.

In a second aspect, the invention provides a method for making an inorganic structure including:

(a) applying a photoreactive composition to a substrate, wherein the composition includes:
   a reactive species,
   a photoinitiator system, and
   a plurality of substantially inorganic, colloidal silica particles, wherein the particles have an average particle size of less than about 300 nm;

(b) photopatterning the composition to define a structure; and (c) subjecting the structure to elevated temperature for a time sufficient to pyrolyze the reactive species and to at least partially fuse the particles.

In a third aspect, the invention provides a method for making a planar optical device including:
(a) applying a photoreactive composition to a substrate, wherein the composition comprises:
a reactive species,
a photoinitiator system, and
a plurality of substantially inorganic colloidal particles, wherein the particles have an average particle size of less than about 300 nm; and
(b) photopatterning the composition to form a planar optical device on the substrate.

In a fourth aspect, the invention provides a photoreactive composition including:
an organic reactive species,
a photoinitiator system; and
a plurality of substantially inorganic colloidal particles, wherein the particles have an average particle size of less than about 300 nm and are present in the composition at less than about 65% by volume,
wherein the composition has a viscosity of greater than 15,000 centipoise at room temperature and a shear rate of 1 Hz.

In a fifth aspect, the invention provides a planar optical device including a plurality of substantially inorganic colloidal particles, wherein the particles have an average particle size of less than about 300 nm and are at least partially fused.

In a sixth aspect, the invention provides an epoxy formulation including:
an epoxy resin,
a photoinitiator system; and
a plurality of substantially inorganic colloidal silica particles, wherein the particles have an average particle size of less than about 300 nm,
and wherein the formulation has a viscosity of greater than 15,000 centipoise at room temperature and a shear rate of 1 Hz.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 2 shows a scanning electron micrograph (SEM) of a photopatterned and developed microstructure prepared from epoxy resin and 20 nm silica particles.

FIG. 3 shows a scanning electron micrograph of a microstructure prepared from epoxy resin and 550 nm silica particles.

FIG. 4 shows a scanning electron micrograph of a microstructure prepared from epoxy resin and a distribution of silica particles with a mean diameter of 4.5 microns.

DETAILED DESCRIPTION

Figure 1A:
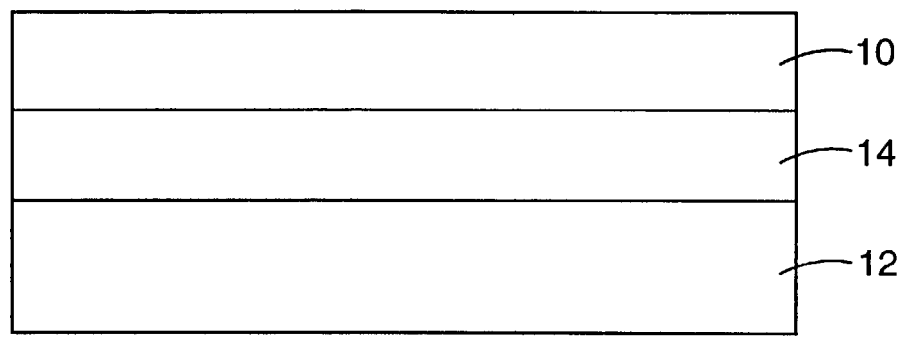
FIGS. 1A–1C shows a schematic diagram illustrating a method for preparing a planar optical waveguide in accordance with the invention.

The invention provides a method of generating a three-dimensional structure from a photoreactive composition that includes a plurality of substantially inorganic particles. The three-dimensional structure can be further pyrolyzed and sintered leaving a substantially inorganic structure.

The photoreactive compositions can be applied on a substrate by any of a variety of application methods. The compositions can be applied by coating methods such as knife or bar coating, or by application methods such as dipping, immersion, spraying, brushing, spin coating, curtain coating and the like. Alternatively, the composition can be applied drop-wise. The photoreactive compositions can be thixotropic or show Theological behavior that is sensitive to both the particular surface treatment of the inorganic particles and their compatibility with the organic components. Thus, appropriate solvent content and shear conditions need to be optimized for each particular composition and coating method to achieve uniform films of the desired thickness. Following coating, the reactive composition can, optionally, be soft baked (for example on a hot plate or in an oven) to remove some or all of the residual solvent. The substrate can be made of any suitable material (e.g., glass, fused silica, silicon, calcium fluoride) and can be chosen from a wide variety of films, sheets, wafers, and other surfaces, depending upon the particular application and the method of exposure to be utilized. The substrate can optionally be pre-treated with a primer (for example, silane coupling agents) to enhance adhesion of the photoreactive composition to the substrate.

The photoreactive compositions can be photopatterned using standard photolithography techniques such as contact or projection lithography (See for example W. Moreau, Semiconductor Lithography: Principles, Practices, and Materials ($3^{rd}$ Ed.), Plenum Press: New York, 1991). The light source can be any light source that produces actinic radiation (i.e., radiation capable of initiating a photoreaction process) and can, in practice, be any light source that provides sufficient intensity at a wavelength appropriate for the photoinitiator or photosensitizer used in the photoreactive composition. Such wavelengths are generally in the ultraviolet or visible portion of the electromagnetic spectrum and can be in the range of about 150 to about 800 nm; preferably, from about 200 to about 600 nm; more preferably, from about 240 to about 500 nm. Exposure times generally depend upon the type of exposure system used to cause image formation (and its accompanying variables such as numerical aperture, geometry of light intensity spatial distribution, and average light intensity), as well as upon the nature of the photoreactive composition exposed.

The radiation induces a reaction in the reactive composition that produces a material having solubility characteristics different from those of the unexposed reactive composition. The resulting pattern of reacted material can then be developed by removing either the exposed or the unexposed regions with an appropriate solvent. An optional post-exposure bake following exposure but prior to development can be required for photoreactive compositions containing epoxy type reactive species.

The resulting structures can have any suitable size and shape, but the method of the invention is particularly well suited for forming microstructured articles. The structures can be formed on the surface of the article or on top of a feature already existing on the surface. Where such feature(s) exist on the surface of an article, for example, continuous or discontinuous patterns of depressions, protrusions, posts, channels, or structures can be formed. The feature(s) can be microscopic, where the term "microscopic" refers to features of small enough dimension so as to require an optic aid to the naked eye when viewed from any plane of view to determine its shape. One criterion is found in *Modern Optic Engineering* by W. J. Smith, McGraw-Hill, 1966, pages 104–105 whereby visual acuity, " . . . is defined and measured in terms of the angular size of the smallest character that can be recognized." Normal visual acuity is considered to be when the smallest recognizable letter subtends an angular height of 5 minutes of arc on the retina. At typical working distance of 250 mm (10 inches), this yields a lateral dimension of 0.36 mm (0.0145 inch) for this object. As used herein, the term "microstructure" means the configuration of features wherein at least 2 dimensions of the features are microscopic.

The photopatterned microstructures can then be pyrolyzed to remove the remaining organic components (less soluble, reacted or unreacted). Typical pyrolysis conditions include heating the structure to a temperature of between about 500° C. to about 900° C. for about 60 minutes to about 240 minutes. Following pyrolysis, the structure is substantially inorganic and comprises substantially close-packed spheres with voids defined by the size of the particles. For some applications it can be desirable to leave the structure porous. In other applications, the porous structure can be sintered further to yield a substantially consolidated inorganic structure. Typical sintering conditions include heating the structure to a temperature in the range of about 900° C. to about 1400° C. for about 2 hours to about 48 hours. To aid in the consolidation process, the porous, pyrolyzed structures can be doped with a variety of materials, such as metal salts or other fluxing agents including but not limited to boron oxide, boric acid, borax, and sodium phosphate. Alternatively, sol-gel precursors, such as tetraethoxygermanium and tetraethoxysilane, can be imbibed into the pores to aid in reducing the porosity and/or adding functionality to the device. Doping of these porous structures with fluxing agents and/or sol-gel precursors followed by further sintering allows for the production of substantially consolidated inorganic structures. In addition, other materials such as organometallic precursors can be added to the porous structure in order to impart additional properties and/or function to the fabricated device.

Figure 1B:
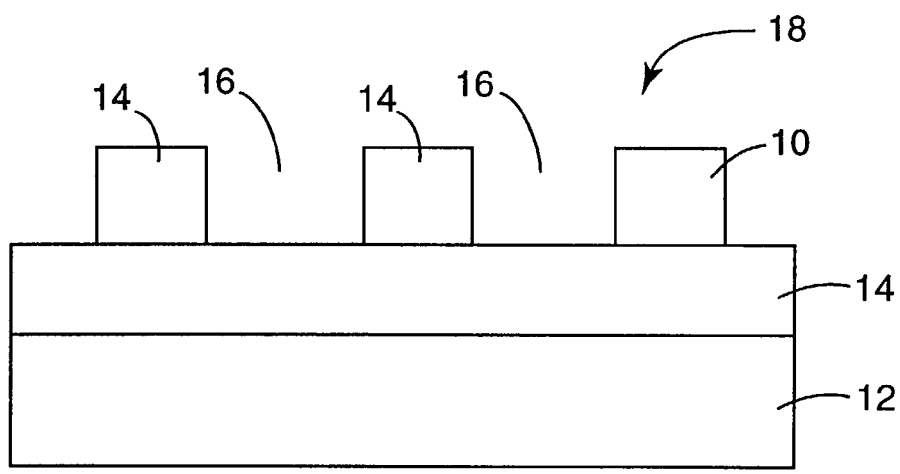

In a preferred embodiment of the invention, a method of making a planar optical device, such as an optical waveguide is described. Referring to FIG. 1A, a photoreactive composition 10 can be applied to a substrate 12, such as a glass slide or silicon wafer. A low-refractive index buffer 14 (e.g., low index silica) optionally can be applied to the substrate 12 prior to application of the photoreactive composition 10. The photoreactive composition 10 can be exposed through a mask with a stripe-like pattern, to selectively react portions of the photoreactive composition. The soluble portion of the composition can then be removed by development with an appropriate solvent to yield a series of ridges 14 separated by spaces 16, as shown in FIG. 1b. Given that refractive index requirements are satisfied, the ridges of reacted material form optical waveguides 18.

Figure 1C:
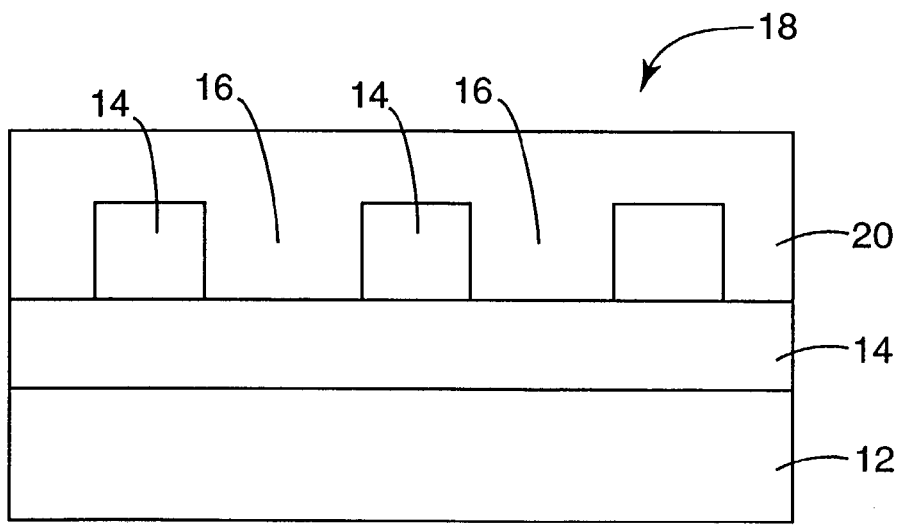

Referring to FIG. 1c, the photopatterned optical waveguide 18 can be pyrolyzed to remove the organic components, doped or treated with fluxing agents as described above, and then sintered. A low-index (20) cladding optionally can be applied over the exposed patterned surface. Thus, an optical waveguide can be added to an already-fabricated substrate without requiring any molding or embossing steps, avoiding the difficulties of the de-molding process associated with structures having micron size dimensions. The planar optical device can be used, for example, as a planar optical waveguide, having dimensions suitable for good mode matching to single mode or multi-mode optical fiber. In one embodiment, the photopatterned optical waveguide and cladding can be fabricated from the same type of photoreactive composition. The core can be either doped to raise the refractive index or consolidated to a greater degree than the cladding in order to achieve waveguiding.

Examples of other optical devices that can be fabricated by the method of the present invention include but are not limited to splitters, couplers, and ring resonators.

Other optical devices that can be fabricated by the method of the present invention include sensors. In these applications, it can be desirable to leave the waveguide structure partially porous, so that waveguiding properties can be changed in different environments. For example, on exposure to a gas, capillary condensation can occur in the nanometer sized pores of the core and/or the cladding of the wave guide. Capillary condensation of materials into the pores of the waveguide results in changes in refractive index profiles thereby affecting waveguiding properties allowing the optical device to be used as a sensor.

In addition to optical devices this method is applicable for the fabrication of other small inorganic structures such as microchannels for applications in areas such as microfluidics or microelectronics.

Reactive Compositions

The photoreactive compositions that can be used to form the above-described structures include curable or non-curable reactive species, a photoinitiator system, and a plurality of substantially inorganic colloidal particles.

Compositions of the invention can optionally further include non-reactive species.

Curable species include addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (including, for example, epoxies, vinyl ethers, and cyanate esters), and the like, and mixtures thereof.

Suitable ethylenically-unsaturated species are described, for example, in U.S. Pat. No. 5,545,676, and include mono-, di-, and poly-acrylates and methacrylates (for example, methyl acrylate, methyl methacrylate, ethyl acrylate, isopropyl methacrylate, n-hexyl acrylate, stearyl acrylate, allyl acrylate, glycerol diacrylate, glycerol triacrylate, ethyleneglycol diacrylate, diethyleneglycol diacrylate, triethyleneglycol dimethacrylate, 1,3-propanediol diacrylate, 1,3-propanediol dimethacrylate, trimethylolpropane triacrylate, 1,2, 4-butanetriol trimethacrylate, 1,4-cyclohexanediol diacrylate, pentaerythritol triacrylate, pentaerythritol tetraacrylate, pentaerythritol tetramethacrylate, sorbitol hexacrylate, bis[1-(2-acryloxy)]-p-ethoxyphenyldimethylmethane, bis[1-(3-acryloxy-2-hydroxy)]-p-propoxyphenyldimethylmethane, tris-hydroxyethyl-isocyanurate trimethacrylate, the bis-acrylates and bis-methacrylates of polyethylene glycols of molecular weight about 200–500, copolymerizable mixtures of acrylated monomers such as those described in U.S. Pat. No. 4,652,274, and acrylated oligomers such as those described in U.S. Pat. No. 4,642, 126); unsaturated amides (for example, methylene bis-acrylamide, methylene bis-methacrylamide, 1,6-hexamethylene bis-acrylamide, diethylene triamine tris-acrylamide and beta-methacrylaminoethyl methacrylate); vinyl compounds (for example, styrene, diallyl phthalate, divinyl succinate, divinyl adipate, and divinyl phthalate); and the like; and mixtures thereof.

Suitable curable reactive polymers include polymers with pendant (meth)acrylate groups, for example, having from 1 to about 50 (meth)acrylate groups per polymer chain. Examples of such polymers include aromatic acid (meth) acrylate half ester resins such as those available under the trade designation SARBOX from Sartomer (for example, SARBOX 400, 401, 402, 404, and 405). Other useful polymers curable by free radical chemistry include those polymers that have a hydrocarbyl backbone and pendant peptide groups with free-radically polymerizable functionality attached thereto, such as those described in U.S. Pat. No. 5,235,015. Mixtures of two or more monomers, oligomers, and/or reactive polymers can be used if desired. Preferred ethylenically-unsaturated species include acrylates, aromatic acid (meth)acrylate half ester resins, and polymers that have a hydrocarbyl backbone and pendant peptide groups with free-radically polymerizable functionality attached thereto.

Suitable cationically-curable species are described, for example, in U.S. Pat. Nos. 5,998,495 and 6,025,406 and include epoxy resins. Such materials, broadly called epoxides, include monomeric epoxy compounds and epoxides of the polymeric type and can be aliphatic, alicyclic, aromatic, or heterocyclic. These materials generally have, on the average, at least 1 polymerizable epoxy group per molecule (preferably, at least about 1.5 and, more preferably, at least about 2). The polymeric epoxides include linear polymers having terminal epoxy groups (for example, a diglycidyl ether of a polyoxyalkylene glycol), polymers having skeletal oxirane units (for example, polybutadiene polyepoxide), and polymers having pendant epoxy groups (for example, a glycidyl methacrylate polymer or copolymer). The epoxies can be pure compounds or can be mixtures of compounds containing one, two, or more epoxy groups per molecule. These epoxy-containing materials can vary greatly in the nature of their backbone and substituent groups. For example, the backbone can be of any type and substituent groups thereon can be any group that does not substantially interfere with cationic cure at room temperature. Illustrative of permissible substituent groups include halogens, ester groups, ethers, sulfonate groups, siloxane groups, nitro groups, phosphate groups, and the like. The molecular weight of the epoxy-containing materials can vary from about 58 to about 100,000 or more.

Useful epoxy-containing materials include those which contain cyclohexene oxide groups such as epoxycyclohexanecarboxylates, typified by 3,4-epoxycyclohexylmethyl-3, 4-epoxycyclohexanecarboxylate, 3,4-epoxy-2-methylcyclohexylmethyl-3,4-epoxy-2-methylcyclohexane carboxylate, and bis(3,4-epoxy-6-methylcyclohexylmethyl) adipate. A more detailed list of useful epoxides of this nature is set forth in U.S. Pat. No. 3,117,099.

Other epoxy-containing materials that are useful include glycidyl ether monomers of the formula:

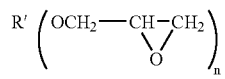

where R' is alkyl or aryl and n is an integer of 1 to 6. Examples are glycidyl ethers of polyhydric phenols obtained by reacting a polyhydric phenol with an excess of a chlorohydrin such as epichlorohydrin (for example, the diglycidyl ether of 2,2-bis-(2,3-epoxypropoxyphenol)-propane). Additional examples of epoxides of this type are described in U.S. Pat. No. 3,018,262, and in *Handbook of Epoxy Resins*, Lee and Neville, McGraw-Hill Book Co., New York (1967).

Numerous commercially available epoxy resins can also be utilized. In particular, epoxides that are readily available include octadecylene oxide, epichlorohydrin, styrene oxide, vinyl cyclohexene oxide, glycidol, glycidylmethacrylate, diglycidyl ethers of Bisphenol A (for example, those available under the trade designations EPON 828, EPON 825, EPON 1004, and EPON 1010 from Resolution Performance Products, formerly Shell Chemical Co., as well as those available under the trade designations DER 331, DER 332, and DER 334 from Dow Chemical Co.), vinylcyclohexene dioxide (for example, the compounds available under the trade designations ERL 4206 from Union Carbide Corp.), 3,4-epoxycyclohexylmethyl-3,4-epoxycyclohexene carboxylate (for example, the compounds available under the trade designations ERL 4221, Cyracure UVR 6110 or UVR 6105 from Union Carbide Corp.), 3,4-epoxy-6-methylcyclohexylmethyl-3,4-epoxy-6-methyl-cyclohexene carboxylate (for example, the compounds available under the trade designation ERL 4201 from Union Carbide Corp.), bis(3,4-epoxy-6-methylcyclohexylmethyl) adipate (for example, the compounds available under the trade designation ERL 4289 from Union Carbide Corp.), bis(2,3-epoxycyclopentyl) ether (for example, the compounds available under the trade designation ERL 0400 from Union Carbide Corp.), aliphatic epoxy modified from polypropylene glycol (for example, those available under the trade designations ERL 4050 and ERL 4052 from Union Carbide Corp.), dipentene dioxide (for example, the compounds available under the trade designation ERL 4269 from Union Carbide Corp.), epoxidized polybutadiene (for example, the compounds available under the trade designations Oxiron 2001 from FMC Corp.), silicone resin containing epoxy functionality, flame retardant epoxy resins (for example, those available under the trade designation DER 580, a brominated bisphenol type epoxy resin available from Dow Chemical Co.), 1,4-butanediol diglycidyl ether of phenolformaldehyde novolak (for example, those available under the trade designations DEN 431 and DEN 438 from Dow Chemical Co.), resorcinol diglycidyl ether (for example, the compounds available under the trade designation KOPOXITE from Koppers Company, Inc.), bis(3,4-epoxycyclohexyl)adipate (for example, those available under the trade designations ERL 4299 or UVR 6128, from Union Carbide Corp.), 2-(3,4-epoxycyclohexyl-5, 5-spiro-3,4-epoxy) cyclohexane-meta-dioxane (for example, the compounds available under the trade designation ERL-4234 from Union Carbide Corp.), vinylcyclohexene monoxide 1,2-epoxyhexadecane (for example, the compounds available under the trade designation UVR-6216 from Union Carbide Corp.), alkyl glycidyl ethers such as alkyl $C_8$–$C_{10}$ glycidyl ether (for example, those available under the trade designation HELOXY MODIFIER 7 from Resolution Performance Products), alkyl $C_{12}$–$C_{14}$ glycidyl ether (for example, those available under the trade designation HELOXY MODIFIER 8 from Resolution Performance Products), butyl glycidyl ether (for example, those available under the trade designation HELOXY MODIFIER 61 from Resolution Performance Products), cresyl glycidyl ether (for example, HELOXY MODIFIER 62 from Resolution Performance Products), p-tert-butylphenyl glycidyl ether (for example, Heloxy Modifier 65 from Resolution Performance Products), polyfunctional glycidyl ethers such as diglycidyl ether of 1,4-butanediol (for example, HELOXY MODIFIER 67 from Resolution Performance Products), diglycidyl ether of neopentyl glycol (for example, HELOXY MODIFIER 68 from Resolution Performance Products), diglycidyl ether of cyclohexanedimethanol (for example, HELOXY MODIFIER 107 from Resolution Performance Products), trimethylol ethane triglycidyl ether (for example, HELOXY MODIFIER 44 from Resolution Performance Products), trimethylol propane triglycidyl ether (for example, HELOXY MODIFIER 48 from Resolution Performance Products), polyglycidyl ether of an aliphatic polyol (for example, HELOXY MODIFIER 84 from Resolution Performance Products), polyglycol diepoxide (for example, HELOXY MODIFIER 32 from Resolution Performance Products), bisphenol F epoxies (for example, those available under the trade designations EPON 1138 from Resolution Performance Products or GY-281 from Ciba-Geigy Corp.), and 9,9-bis[4-(2,3-epoxypropoxy)-phenyl]fluorenone (for example, those available under the trade designation EPON 1079 from Resolution Performance Products).

Other useful epoxy resins comprise copolymers of acrylic acid esters of glycidol (such as glycidylacrylate and glycidylmethacrylate) with one or more copolymerizable vinyl compounds. Examples of such copolymers are 1:1 styrene-glycidylmethacrylate, 1:1 methylmethacrylate-glycidylacrylate, and a 62.5:24:13.5 methylmethacrylate-ethyl acrylate-glycidylmethacrylate. Other useful epoxy resins are well known and contain such epoxides as epichlorohydrins, alkylene oxides (for example, propylene oxide), styrene oxide, alkenyl oxides (for example, butadiene oxide), and glycidyl esters (for example, ethyl glycidate).

Useful epoxy-functional polymers include epoxy-functional silicones such as those described in U.S. Pat. No. 4,279,717, which are commercially available from the General Electric Company. These are polydimethylsiloxanes in which 1–20 mole % of the silicon atoms have been substituted with epoxyalkyl groups (preferably, epoxy cyclohexylethyl, as described in U.S. Pat. No. 5,753,346).

Blends of various epoxy-containing materials can also be utilized. Such blends can comprise two or more weight average molecular weight distributions of epoxy-containing compounds (such as low molecular weight (below 200), intermediate molecular weight (about 200 to 10,000), and higher molecular weight (above about 10,000)). Alternatively or additionally, the epoxy resin can contain a blend of epoxy-containing materials having different chemical natures (such as aliphatic and aromatic) or functionalities (such as polar and non-polar). Other cationically-reactive polymers (such as vinyl ethers and the like) can additionally be incorporated, if desired.

Preferred epoxies include aromatic glycidyl epoxies (such as the EPON resins available from Resolution Performance Products) and cycloaliphatic epoxies (such as ERL 4221 and ERL 4299 available from Union Carbide).

Suitable cationically-curable species also include vinyl ether monomers, oligomers, and reactive polymers (for example, methyl vinyl ether, ethyl vinyl ether, tert-butyl vinyl ether, isobutyl vinyl ether, triethyleneglycol divinyl ether (for example, those available under the trade designation RAPI-CURE DVE-3 from International Specialty Products, Wayne, N.J.), trimethylolpropane trivinyl ether (for example, those available under the trade designation TMPTVE from BASF Corp., Mount Olive, N.J.), and those available under the trade designation VECTOMER divinyl ether resins from Allied Signal (for example, VECTOMER 2010, VECTOMER 2020, VECTOMER 4010, and VECTOMER 4020 and their equivalents available from other manufacturers)), and mixtures thereof. Blends (in any proportion) of one or more vinyl ether resins and/or one or more epoxy resins can also be utilized. Polyhydroxy-functional materials (such as those described, for example, in U.S. Pat. No. 5,856,373) can also be utilized in combination with epoxy- and/or vinyl ether-functional materials.

Non-curable reactive species include, for example, reactive polymers whose solubility can be increased upon acid- or radical-induced reaction. Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists described by R. D. Allen, G. M. Wallraff, W. D. Hinsberg, and L. L. Simpson in "High Performance Acrylic Polymers for Chemically Amplified Photoresist Applications," J. Vac. Sci. Technol. B, 9, 3357 (1991). The chemically-amplified photoresist concept is now widely used for microchip manufacturing, especially with sub-0.5 micron (or even sub-0.2 micron) features. In such photoresist systems, catalytic species (typically hydrogen ions) can be generated by irradiation, which induces a cascade of chemical reactions, thereby amplifying reaction rate. Examples of typical acid-catalyzed chemically-amplified photoresist systems include deprotection (for example, t-butoxycarbonyloxystyrene resists as described in U.S. Pat. No. 4,491,628, tetrahydropyran (THP) methacrylate-based materials, THP-phenolic materials such as those described in U.S. Pat. No. 3,779,778, t-butyl methacrylate-based materials such as those described by R. D Allen et al. in Proc. SPIE 2438, 474 (1995), and the like); depolymerization (for example, polyphthalaldehyde-based materials); and rearrangement (for example, materials based on the pinacol rearrangements).

Photoinitiator System

The photoinitiator system can be a one-component, a two-component, or a three-component system. A one-component system comprises a photochemically effective amount of at least one photoinitiator. Examples of such compounds include photoinitiators that generate a free radical source or cationic photocatalysts that generate an acid (including either protic or Lewis acids) when exposed to radiation having a wavelength in the ultraviolet or visible portion of the electromagnetic spectrum.

Useful free-radical photoinitiators include acetophenones, benzophenones, aryl glyoxalates, acylphosphine oxides, benzoin ethers, benzil ketals, thioxanthones, aromatic sulfonyl chlorides, photoactive oximes, nitroso compounds, acyl halides, hydrozones, chloroalkyltriazines, bisimidazoles, triacylimidazoles, pyrylium compounds, sulfonium and iodonium salts, mercapto compounds, quinones, azo compounds, organic peroxides, and mixtures thereof. Some examples of such photoinitiators are described, for example, in U.S. Pat. No. 6,054,007 (Boyd et al.) (see column 16, line 58, through column 17, line 7), U.S. Pat. No. 5,235,744 (Williams et al.) (column 11, line 26 through column 12, line 65), and U.S. Pat. No. 4,735,632 (Oxman et al.) (column 3, lines 26 through 47), which descriptions are incorporated herein by reference.

Useful cationic photocatalysts include metallocene salts having an onium cation and a halogen-containing complex anion of a metal or metalloid. Other useful cationic photocatalysts include a metallocene salt having an organometallic complex cation and a halogen-containing complex anion of a metal or metalloid. Such photocatalysts are further described, for example, in U.S. Pat. No. 4,751,138 (Tumey et al.) (see, for example, column 6, line 65, through column 9, line 45), U.S. Pat. No. 6,054,007 (column 14, line 20 through column 16, line 13), and U.S. Pat. No. 5,238,744 (see column 10, line 12, through column 11, line 3), which descriptions are incorporated herein by reference. Mixtures of photocatalysts are also useful.

Such free-radical photoinitiators and cationic photocatalysts and methods for their preparation are known in the art. Many are commercially available.

Alternatively, useful two-component and three-component photoinitiator systems comprise photochemically effective amounts of (1) at least one photosensitizer; and (2) either or both of (i) at least one electron donor compound different from the photosensitizer and capable of donating an electron to an electronic excited state of the photosensitizer (preferably, an electron donor compound having an oxidation potential that is greater than zero and less than or equal to that of p-dimethoxybenzene); and (ii) at least one photoinitiator that is capable of being photosensitized by accepting an electron from an electronic excited state of the photosensitizer, resulting in the formation of at least one free radical and/or acid (preferably, a photoinitiator selected from the group consisting of iodonium salts, sulfonium salts, diazonium salts, azinium salts, chloromethylated triazines, and triarylimidazolyl dimers).

Photosensitizers

Photosensitizers suitable for use in the photoinitiator system of the photoreactive compositions are those preferably capable of light absorption somewhere within the range of wavelengths between about 150 and about 800 nanometers (more preferably, between about 200 and about 600 nanometers; and, more preferably, between about 240 and about 500 nanometers).

Preferably, the photosensitizer is substantially free of functionalities that would substantially interfere with the reaction of the reactive species and is soluble in the reactive species (if the reactive species is liquid) or is compatible with the reactive species and with any binders (as described below) that are included in the composition. Most preferably, the photosensitizer is also capable of sensitizing 2-methyl-4,6-bis(trichloromethyl)-s-triazine under continuous irradiation in a wavelength range that overlaps the single photon absorption spectrum of the photosensitizer, using the test procedure described in U.S. Pat. No. 3,729,313. Using currently available materials, that test can be carried out as follows:

A standard test solution can be prepared having the following composition: 5.0 parts of a 5% (weight by volume) solution in methanol of 45,000–55,000 molecular weight, 9.0–13.0% hydroxyl content polyvinyl butyral (Butvar B76, Monsanto);

0.3 parts trimethylolpropane trimethacrylate; and 0.03 parts 2-methyl-4,6-bis(trichloromethyl)-s-triazine (see Bull. Chem. Soc. Japan, 42, 2924–2930 (1969)).

To this solution can be added 0.01 parts of the compound to be tested as a photosensitizer. The resulting solution can then be knife-coated onto a 0.05 mm clear polyester film using a knife orifice of 0.05 mm, and the coating can be air dried for about 30 minutes. A 0.05 mm clear polyester cover film can be carefully placed over the dried but soft and tacky coating with minimum entrapment of air. The resulting sandwich construction can then be exposed for three minutes to 161,000 Lux of incident light from a tungsten light source providing light in both the visible and ultraviolet range (FCH 650 watt quartz-iodine lamp, General Electric). Exposure can be made through a stencil so as to provide exposed and unexposed areas in the construction. After exposure the cover film can be removed, and the coating can be treated with a finely divided colored powder, such as a color toner powder of the type conventionally used in xerography. If the tested compound is a photosensitizer, the trimethylolpropane trimethacrylate monomer will be polymerized in the light-exposed areas by the light-generated free radicals from the 2-methyl-4,6-bis(trichloromethyl)-s-triazine. Since the polymerized areas will be essentially tack-free, the colored powder will selectively adhere essentially only to the tacky, unexposed areas of the coating, providing a visual image corresponding to that in the stencil.

Preferably, a photosensitizer can also be selected based in part upon shelf stability considerations. Accordingly, selection of a particular photosensitizer can depend to some extent upon the particular reactive species utilized (as well as upon the choices of electron donor compound and/or photoinitiator).

Suitable photosensitizers are believed to include compounds in the following categories: ketones, coumarin dyes (for example, ketocoumarins), xanthene dyes, acridine dyes, thiazole dyes, thiazine dyes, oxazine dyes, azine dyes, aminoketone dyes, porphyrins, aromatic polycyclic hydrocarbons, p-substituted aminostyryl ketone compounds, aminotriaryl methanes, merocyanines, squarylium dyes, and pyridinium dyes. Ketones (for example, monoketones or alpha-diketones), ketocoumarins, arimnoarylketones, and p-substituted arinostyryl ketone compounds are preferred photosensitizers. Mixtures of photosensitizers can also be utilized. For applications requiring high sensitivity (for example, graphic arts), it is generally preferred to employ a photosensitizer containing a julolidinyl moiety. A preferred class of ketone photosensitizers comprises those represented by the following general formula:

where X is CO or $CR^1R^2$, where $R^1$ and $R^2$ can be the same or different and can be hydrogen, alkyl, alkaryl, or aralkyl; b is zero; and A and B can be the same or different and can be substituted (having one or more non-interfering substituents) or unsubstituted aryl, alkyl, alkaryl, or aralkyl groups, or together A and B can form a cyclic structure that can be a substituted or unsubstituted alicyclic, aromatic, heteroaromatic, or fused aromatic ring.

Suitable ketones of the above formula include monoketones (b=0) such as 2,2-, 4,4-, or 2,4-dihydroxybenzophenone, di-2-pyridyl ketone, di-2-furanyl ketone, di-2-thiophenyl ketone, benzoin, fluorenone, chalcone, Michler's ketone, 2-fluoro-9-fluorenone, 2-chlorothioxanthone, acetophenone, benzophenone, 1- or 2-acetonaphthone, 9-acetylanthracene, 2-, 3- or 9-acetylphenanthrene, 4-acetylbiphenyl, propiophenone, n-butyrophenone, valerophenone, 2-, 3- or 4-acetylpyridine, 3-acetylcoumarin, and the like. Suitable diketones include aralkyldiketones such as anthraquinone, phenanthrenequinone, o-, m- and p-diacetylbenzene, 1,3-, 1,4-, 1,5-, 1,6-, 1,7- and 1,8-diacetylnaphthalene, 1,5-, 1,8- and 9,10-diacetylanthracene, and the like. Suitable alpha-diketones (b=1 and x=CO) include 2,3-butanedione, 2,3-pentanedione, 2,3-hexanedione, 3,4-hexanedione, 2,3-heptanedione, 3,4-heptanedione, 2,3-octanedione, 4,5-octanedione, benzil, 2,2'-3,3'- and 4,4'-dihydroxylbenzil, furil, di-3,3'-indolylethanedione, 2,3-bornanedione (camphorquinone), biacetyl, 1,2-cyclohexanedione, 1,2-naphthaquinone, acenaphthaquinone, and the like.

Preferred ketocoumarins and p-substituted aminostyryl ketone compounds include 3-(p-dimethylaminocinnamoyl)-7-dimethyl-aminocoumarin, 3-(p-dimethylaminocinnamoyl)-7-dimethyl-aminocoumarin, 3-(p-diethylaminocinnamoyl)-7-dimethyl-aminocoumarin, 3-(p- diethylaminocinnamoyl)-7-dimethyl-aminocoumarin, 9'-julolidine-4-piperidinoacetophenone, 9'-julolidine-4-piperidinoacetophenone, 9-(4-diethylarminocinnamoyl)-1,2,4,5-tetrahydro-3H,6H,10H[1]benzopyrano[6,7,8-i,j]quinolizine-10-one, 9-(4-diethylaminocinnamoyl)-1,2,4,5-tetrahydro-3H,6H,10H[1]benzopyrano[6,7,8-i,j]-quinolizine-10-one, 9-(4-dicyanoethylaminocinnamoyl)-1,2,4,5-tetra-hydro-3H,6H,10H[1]benzopyrano[6,7,8-i,j]-quinolizine-10-one, 9-(4-dicyanoethylaminocinnamoyl)-1,2,4,5-tetra-hydro-3H,6H,10H[1]benzopyrano[6,7,8-i,j]-quinolizine-10-one, 2,3-bis(9'-julolidine)cyclopentanone, 2,3-bis(9'-julolidine)cyclopentanone, 9-ethoxycarbonyl-1,2,4,5-tetrahydro-3H,6H,10H-[1]benzopyrano[6,7,8-i,j]quinolizine-10-one, 9-ethoxycarbonyl-1,2,4,5-tetrahydro-3H,6H,10H-[1]benzopyrano[6,7,8-i,j]quinolizine-10-one, 2-(4'-diethylaminobenzylidine)-1-indanone, 2-(4'-diethylaminobenzylidine)-1-indanone, 9-acetyl-1,2,4,5-tetrahydro-3H,6H,10H[1]benzo-pyrano[6,7,8-i,j]quinolizine-10-one, 9-acetyl-1,2,4,5-tetrahydro-3H,6H,10H[1]benzopyrano[6,7,8-i,j]quinolizine-10-one, 5,10-diethoxy-12,16,17-trichloroviolanthrene, and 5,10-diethoxy-12,16,17-trichloroviolanthrene, and the like.

Other useful photosensitizers include those described in WO 01/96409, the description of which is incorporated herein by reference.

Particularly preferred photosensitizers include camphorquinone, glyoxal, biacetyl, 3,3,6,6-tetramethylcyclohexanedione, 3,3,7,7-tetramethyl-1,2-cycloheptanedione, 3,3,8,8-tetramethyl-1,2-cyclooctanedione, 3,3,18,18-tetramethyl-1,2-cyclooctadecanedione, dipivaloyl, benzil, furil, hydroxybenzil, 2,3-butanedione, 2,3-pentanedione, 2,3-hexanedione, 3,4-hexanedione, 2,3-heptanedione, 3,4-heptanedione, 2,3-octanedione, 4,5-octanedione, and 1,2-cyclohexanedione. Of these, camphorquinone is most preferred. It will be apparent to one skilled in the art, that the choice of exposure wavelength and photosensitizer is dictated by both the lithographic resolution required and the amount of light scattering from the inorganic particles as a function of wavelength.

Electron Donor Compounds

Electron donor compounds useful in the one-photon photoinitiator system of the photoreactive compositions are those compounds (other than the photosensitizer itself) that are capable of donating an electron to an electronic excited state of the photosensitizer. Such compounds can be used, optionally, to increase the photosensitivity of the photoinitiator system, thereby reducing the exposure required to effect photoreaction of the photoreactive composition. The electron donor compounds preferably have an oxidation potential that is greater than zero and less than or equal to that of p-dimethoxybenzene. Preferably, the oxidation potential is between about 0.3 and 1 volt vs. a standard saturated calomel electrode ("S.C.E.").

The electron donor compound is also preferably soluble in the reactive species and is selected based in part upon shelf stability considerations (as described above). Suitable donors are generally capable of increasing the speed of cure or the image density of a photoreactive composition upon exposure to light of the desired wavelength.

When working with cationically-reactive species, those skilled in the art will recognize that the electron donor compound, if of significant basicity, can adversely affect the cationic reaction. (See, for example, the discussion in U.S. Pat. No. 6,025,406 (Oxman et al.) at column 7, line 62, through column 8, line 49.)

In general, electron donor compounds suitable for use with particular photosensitizers and photoinitiators can be selected by comparing the oxidation and reduction potentials of the three components (as described, for example, in U.S. Pat. No. 4,859,572 (Farid et al.)). Such potentials can be measured experimentally (for example, by the methods described by R. J. Cox, *Photographic Sensitivity*, Chapter 15, Academic Press (1973)) or can be obtained from references such as N. L. Weinburg, Ed., *Technique of Electroorganic Synthesis Part II: Techniques of Chemistry*, Vol. V (1975), and C. K. Mann and K. K. Barnes, *Electrochemical Reactions in Nonaqueous Systems* (1970). The potentials reflect relative energy relationships and can be used in the following manner to guide electron donor compound selection.

When the photosensitizer is in an electronic excited state, an electron in the highest occupied molecular orbital (HOMO) of the photosensitizer has been lifted to a higher energy level (namely, the lowest unoccupied molecular orbital (LUMO) of the photosensitizer), and a vacancy is left behind in the molecular orbital it initially occupied. The photoinitiator can accept the electron from the higher energy orbital, and the electron donor compound can donate an electron to fill the vacancy in the originally occupied orbital, provided that certain relative energy relationships are satisfied.

If the reduction potential of the photoinitiator is less negative (or more positive) than that of the photosensitizer, an electron in the higher energy orbital of the photosensitizer is readily transferred from the photosensitizer to the lowest unoccupied molecular orbital (LUMO) of the photoinitiator, since this represents an exothermic process. Even if the process is instead slightly endothermic (that is, even if the reduction potential of the photosensitizer is up to 0.1 volt more negative than that of the photoinitiator) ambient thermal activation can readily overcome such a small barrier.

In an analogous manner, if the oxidation potential of the electron donor compound is less positive (or more negative) than that of the photosensitizer, an electron moving from the HOMO of the electron donor compound to the orbital vacancy in the photosensitizer is moving from a higher to a lower potential, which again represents an exothermic process. Even if the process is slightly endothermic (that is, even if the oxidation potential of the photosensitizer is up to 0.1 volt more positive than that of the electron donor compound), ambient thermal activation can readily overcome such a small barrier.

Slightly endothermic reactions in which the reduction potential of the photosensitizer is up to 0.1 volt more negative than that of the photoinitiator, or the oxidation potential of the photosensitizer is up to 0.1 volt more positive than that of the electron donor compound, occur in every instance, regardless of whether the photoinitiator or the electron donor compound first reacts with the photosensitizer in its excited state. When the photoinitiator or the electron donor compound is reacting with the photosensitizer in its excited state, it is preferred that the reaction be exothermic or only slightly endothermic. When the photoinitiator or the electron donor compound is reacting with the photosensitizer ion radical, exothermic reactions are still preferred, but still more endothermic reactions can be expected in many instances to occur. Thus, the reduction potential of the photosensitizer can be up to 0.2 volt (or more) more negative than that of a second-to-react photoinitiator, or the oxidation potential of the photosensitizer can be up to 0.2 volt (or more) more positive than that of a second-to-react electron donor compound.

Suitable electron donor compounds include, for example, those described by D. F. Eaton in *Advances in Photochemistry*, edited by B. Voman et al., Volume 13, pp. 427–488, John Wiley and Sons, New York (1986); by Oxman et al. in U.S. Pat. No. 6,025,406 at column 7, lines 42–61; and by Palazzotto et al. in U.S. Pat No. 5,545,676 at column 4, line 14 through column 5, line 18. Such electron donor compounds include amines (including triethanolamine, hydrazine, 1,4-diazabicyclo[2.2.2]octane, triphenylamine (and its triphenylphosphine and triphenylarsine analogs), aminoaldehydes, and aminosilanes), amides (including phosphoramides), ethers (including thioethers), ureas (including thioureas), sulfinic acids and their salts, salts of ferrocyanide, ascorbic acid and its salts, dithiocarbamic acid and its salts, salts of xanthates, salts of ethylene diamine tetraacetic acid, salts of $(alkyl)_n(aryl)_m$borates (n+m=4) (tetraalkylammonium salts preferred), various organometallic compounds such as $SnR_4$ compounds (where each R is independently chosen from among alkyl, aralkyl (particularly, benzyl), aryl, and alkaryl groups) (for example, such compounds as $n$-$C_3H_7Sn(CH_3)_3$, $(allyl)Sn(CH_3)_3$, and (benzyl) $Sn(n$-$C_3H_7)_3$), ferrocene, and the like, and mixtures thereof. The electron donor compound can be unsubstituted or can be substituted with one or more non-interfering substituents. Particularly preferred electron donor compounds contain an electron donor atom (such as a nitrogen, oxygen, phosphorus, or sulfur atom) and an abstractable hydrogen atom bonded to a carbon or silicon atom alpha to the electron donor atom.

Preferred amine electron donor compounds include alkyl-, aryl-, alkaryl- and aralkyl-amines (for example, methylamine, ethylamine, propylamine, butylamine, triethanolamine, amylamine, hexylamine, 2,4-dimethylaniline, 2,3-dimethylaniline, o-, m- and p-toluidine, benzylamine, aminopyridine, N,N'-dimethylethylenediamine, N,N'-diethylethylenediamine, N,N'-dibenzylethylenediamine, N,N'-diethyl-1,3-propanediamine, N,N'-diethyl-2-butene-1,4-diamine, N,N'-dimethyl-1,6-hexanediamine, piperazine, 4,4'-trimethylenedipiperidine, 4,4'-ethylenedipiperidine, p-N,N-dimethyl-aminophenethanol and p-N-dimethylaminobenzonitrile); aminoaldehydes (for example, p-N,N-dimethylaminobenzaldehyde, p-N,N-diethylaminobenzaldehyde, 9-julolidine carboxaldehyde, and 4-morpholinobenzaldehyde); and aminosilanes (for example, trimethylsilylmorpholine, trimethylsilylpiperidine, bis (dimethylamino)diphenylsilane, tris(dimethylamino) methylsilane, N,N-diethylaminotrimethylsilane, tris (dimethylamino)phenylsilane, tris(methylsilyl)amine, tris (dimethylsilyl)amine, bis(dimethylsilyl)amine, N,N-bis (dimethylsilyl)aniline, N-phenyl-N-dimethylsilylaniline, and N,N-dimethyl-N-dimethylsilylamine); and mixtures thereof. Tertiary aromatic alkylamines, particularly those having at least one electron-withdrawing group on the aromatic ring, have been found to provide especially good shelf stability. Good shelf stability has also been obtained using amines that are solids at room temperature. Good photographic speed has been obtained using amines that contain one or more julolidinyl moieties.

Preferred amide electron donor compounds include N,N-dimethylacetamide, N,N-diethylacetamide, N-methyl-N-phenylacetamide, hexamethylphosphoramide, hexaethylphosphoramide, hexapropylphosphoramide, trimorpholinophosphine oxide, tripiperidinophosphine oxide, and mixtures thereof.

Preferred alkylarylborate salts include
$Ar_3B^-(n$-$C_4H_9)N^+(C_2H_5)_4$
$Ar_3B^-(n$-$C_4H_9)N^+(CH_3)_4$
$Ar_3B^-(n$-$C_4H_9)N^+(n$-$C_4H_9)_4$
$Ar_3B^-(n$-$C_4H_9)Li^+$
$Ar_3B^-(n$-$C_4H_9)N^+(C_6H_{13})_4$
$Ar_3B^-(C_4H_9)N^+(CH_3)_3(CH_2)_2CO_{2(CH2)}{}_2CH_3$ 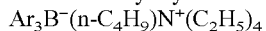
$Ar_3B^-(C_4H_9)N^+(CH_3)_3(CH_2)_2OCO(CH_2)_2CH_3$ 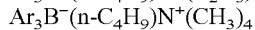
$Ar_3B^-(sec$-$C_4H_9)N^+(CH_3)_3(CH_2)_2CO_2(CH_2)_2CH_3$
$Ar_3B^-(sec$-$C_4H_9)N^+(C_6H_{13})_4$
$Ar_3B^-(C_4H_9)N^+(C_8H_{17})_4$
$Ar_3B^-(C_4H_9)N^+(CH_3)_4$
$(p$-$CH_3O$—$C_6H_4)_3B^-(n$-$C_4H_9)N^+(n$-$C_4H_9)_4$
$Ar_3B^-(C_4H_9)N^+(CH_3)_3(CH_2)_2OH$
$ArB^-(n$-$C_4H_9)_3N^+(CH_3)_4$
$ArB^-(C_2H_5)_3N^+(CH_3)_4$
$Ar_2B^-(n$-$C_4H_9)_2N^+(CH_3)_4$
$Ar_3B^-(C_4H_9)N^+(C_4H_9)_4$
$Ar_4B^-N^+(C_4H_9)_4$
$ArB^-(CH_3)_3N^+(CH_3)_4$
$(n$-$C_4H_9)_4B^-N^+(CH_3)_4$
$Ar_3B^-(C_4H_9)P^+(C_4H_9)_4$
(where Ar is phenyl, naphthyl, substituted (preferably, fluoro-substituted) phenyl, substituted naphthyl, and like groups having greater numbers of fused aromatic rings), as well as tetramethylammonium n-butyltriphenylborate and tetrabutylammonium n-hexyl-tris(3-fluorophenyl)borate (available as CGI 437 and CGI 746 from Ciba Specialty Chemicals Corporation), and mixtures thereof.

Suitable ether electron donor compounds include 4,4'-dimethoxybiphenyl, 1,2,4-trimethoxybenzene, 1,2,4,5-tetramethoxybenzene, and the like, and mixtures thereof. Suitable urea electron donor compounds include N,N'-dimethylurea, N,N-dimethylurea, N,N'-diphenylurea, tetramethylthiourea, tetraethylthiourea, tetra-n-butylthiourea, N,N-di-n-butylthiourea, N,N'-di-n-butylthiourea, N,N-diphenylthiourea, N,N'-diphenyl-N,N'-diethylthiourea, and the like, and mixtures thereof.

Preferred electron donor compounds for free radical-induced reactions include amines that contain one or more julolidinyl moieties, alkylarylborate salts, and salts of aromatic sulfinic acids. However, for such reactions, the electron donor compound can also be omitted, if desired (for example, to improve the shelf stability of the photoreactive composition or to modify resolution, contrast, and reciprocity). Preferred electron donor compounds for acid-induced reactions include 4-dimethylaminobenzoic acid, ethyl 4-dimethylaminobenzoate, 3-dimethylaminobenzoic acid, 4-dimethylaminobenzoin, 4-dimethylaminobenzaldehyde, 4-dimethylaminobenzonitrile, 4-dimethylaminophenethyl alcohol, and 1,2,4-trimethoxybenzene.

Photoinitiators for Two-Component and Three-Component Photoinitiator Systems

Suitable photoinitiators (that is, electron acceptor compounds) for the reactive species of the photoreactive compositions include those that are capable of being photosensitized by accepting an electron from an electronic excited state of the photosensitizer, resulting in the formation of at least one free radical and/or acid. Such photoinitiators include iodonium salts (for example, diaryliodonium salts), chloromethylated triazines (for example, 2-methyl-4,6-bis (trichloromethyl)-s-triazine, 2,4,6-tris(trichloromethyl)-s-triazine, and 2-aryl-4,6-bis(trichloromethyl)-s-triazine), diazonium salts (for example, phenyldiazonium salts optionally substituted with groups such as alkyl, alkoxy, halo, or nitro), sulfonium salts (for example, triarylsulfonium salts optionally substituted with alkyl or alkoxy groups, and optionally having 2,2' oxy groups bridging adjacent aryl moieties), azinium salts (for example, an N-alkoxypyridinium salt), and triarylimidazolyl dimers (preferably, 2,4,5-triphenylimidazolyl dimers such as 2,2',4,4',5,5'-tetraphenyl-1,1'-biimidazole, optionally substituted with groups such as alkyl, alkoxy, or halo), and the like, and mixtures thereof.

The photoinitiator is preferably soluble in the reactive species and is preferably shelf-stable (that is, does not spontaneously promote reaction of the reactive species when dissolved therein in the presence of the photosensitizers and the electron donor compound). Accordingly, selection of a particular photoinitiator can depend to some extent upon the particular reactive species, photosensitizers, and electron donor compound chosen, as described above. If the reactive species is capable of undergoing an acid-initiated chemical reaction, then the photoinitiator is an onium salt (for example, an iodonium, sulfonium, or diazonium salt).

Suitable iodonium salts include those described by Palazzotto et al. in U.S. Pat. No. 5,545,676 at column 2, lines 28 through 46. Suitable iodonium salts are also described in U.S. Pat. Nos. 3,729,313, 3,741,769, 3,808,006, 4,250,053 and 4,394,403. The iodonium salt can be a simple salt (for example, containing an anion such as Cl$^-$, Br$^-$, I$^-$ or $C_4H_5SO_3^-$) or a metal complex salt (for example, containing $SbF_6^-$, $PF_6^-$, $BF_4^-$, tetrakis(perfluorophenyl)borate, $SbF_5OH^-$ or $AsF_6^-$). Mixtures of iodonium salts can be used if desired.

Examples of useful aromatic iodonium complex salt photoinitiators include diphenyliodonium tetrafluoroborate; di(4-methylphenyl)iodonium tetrafluoroborate; phenyl-4-methylphenyliodonium tetrafluoroborate; di(4-heptylphenyl)iodonium tetrafluoroborate; di(3-nitrophenyl)iodonium hexafluorophosphate; di(4-chlorophenyl)iodonium hexafluorophosphate; di(naphthyl)iodonium tetrafluoroborate; di(4-trifluoromethylphenyl)iodonium tetrafluoroborate; diphenyliodonium hexafluorophosphate; di(4-methylphenyl)iodonium hexafluorophosphate; diphenyliodonium hexafluoroarsenate; di(4-phenoxyphenyl)iodonium tetrafluoroborate; phenyl-2-thienyliodonium hexafluorophosphate; 3,5-dimethylpyrazolyl-4-phenyliodonium hexafluorophosphate; diphenyliodonium hexafluoroantimonate; 2,2'-diphenyliodonium tetrafluoroborate; di(2,4-dichlorophenyl) iodonium hexafluorophosphate; di(4-bromophenyl) iodonium hexafluorophosphate; di(4-methoxyphenyl) iodonium hexafluorophosphate; di(3-carboxyphenyl) iodonium hexafluorophosphate; di(3-methoxycarbonylphenyl)iodonium hexafluorophosphate; di(3-methoxysulfonylphenyl)iodonium hexafluorophosphate; di(4-acetamidophenyl)iodonium hexafluorophosphate; di(2-benzothienyl)iodonium hexafluorophosphate; and diphenyliodonium hexafluoroantimonate; and the like; and mixtures thereof. Aromatic iodonium complex salts can be prepared by metathesis of corresponding aromatic iodonium simple salts (such as, for example, diphenyliodonium bisulfate) in accordance with the teachings of Beringer et al., J. Am. Chem. Soc. 81, 342 (1959).

Preferred iodonium salts include diphenyliodonium salts (such as diphenyliodonium chloride, diphenyliodonium hexafluorophosphate, and diphenyliodonium tetrafluoroborate), diaryliodonium hexafluoroantimonate (for example, SARCAT SR 1012 available from Sartomer Company), and mixtures thereof.

Useful chloromethylated triazines include those described in U.S. Pat. No. 3,779,778 (Smith et al.) at column 8, lines 45–50, which include 2,4-bis(trichloromethyl)-6-methyl-s-triazine, 2,4,6-tris(trichloromethyl)-s-triazine, and the more preferred chromophore-substituted vinylhalomethyl-s-triazines disclosed in U.S. Pat. Nos. 3,987,037 and 3,954,475 (Bonham et al.).

Useful diazonium salts include those described in U.S. Pat. No. 4,394,433 (Gatzke), which comprise a light sensitive aromatic moiety (for example, pyrrolidine, morpholine, aniline, and diphenyl amine) with an external diazonium group (—N$^+$=N) and an anion (for example, chloride, tri-isopropyl naphthalene sulfonate, tetrafluoroborate, and the bis(perfluoroalkylsulfonyl)methides) associated therewith. Examples of useful diazonium cations include 1-diazo-4-anilinobenzene, N-(4-diazo-2,4-dimethoxy phenyl)pyrrolidine, 1-diazo-2,4-diethoxy-4-morpholino benzene, 1-diazo-4-benzoyl amino-2,5-diethoxy benzene, 4-diazo-2,5-dibutoxy phenyl morpholino, 4-diazo-1-dimethyl aniline, 1-diazo-N,N-dimethylaniline, 1-diazo-4-N-methyl-N-hydroxyethyl aniline, and the like.

Useful sulfonium salts include those described in U.S. Pat. No. 4,250,053 (Smith) at column 1, line 66, through column 4, line 2, which can be represented by the formulas:

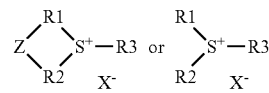

wherein $R_1$, $R_2$, and $R_3$ are each independently selected from aromatic groups having from about 4 to about 20 carbon atoms (for example, substituted or unsubstituted phenyl, naphthyl, thienyl, and furanyl, where substitution can be with such groups as alkoxy, alkylthio, arylthio, halogen, and so forth) and alkyl groups having from 1 to about 20 carbon atoms. As used here, the term "alkyl" includes substituted alkyl (for example, substituted with such groups as halogen, hydroxy, alkoxy, or aryl). At least one of $R_1$, $R_2$, and $R_3$ is aromatic, and, preferably, each is independently aromatic. Z is selected from the group consisting of a covalent bond, oxygen, sulfur, —S(=O)—, —C(=O)—, —(O=)S(=O)—, and —N(R)—, where R is aryl (of about 6 to about 20 carbons, such as phenyl), acyl (of about 2 to about 20 carbons, such as acetyl, benzoyl, and so forth), a carbon-to-carbon bond, or —(R$_4$—)C(—R$_5$)—, where $R_4$ and $R_5$ are independently selected from the group consisting of hydrogen, alkyl groups having from 1 to about 4 carbon atoms, and alkenyl groups having from about 2 to about 4 carbon atoms. X$^-$ is an anion, as described below.

Suitable anions, X$^-$, for the sulfonium salts (and for any of the other types of photoinitiators) include a variety of anion types such as, for example, imide, methide, boron-centered, phosphorous-centered, antimony-centered, arsenic-centered, and aluminum-centered anions.

Illustrative, but not limiting, examples of suitable imide and methide anions include $(C_2F_5SO_2)_2N^-$, $(C_4F_9SO_2)_2N^-$, $(C_8F_{17}SO_2)_3C^-$, $(CF_3SO_2)_3C^-$, $(CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $((CF_3)_2NC_2F_4SO_2)_2N^-$, $(CF_3)_2NC_2F_4SO_2C^-(SO_2CF_3)_2$, $(3,5\text{-bis}(CF_3)C_6H_3)SO_2N^-SO_2CF_3$, $C_6H^5SO_2C^-(SO_2CF_3)_2$, $C_6H_5SO_2N^-SO_2CF_3$, and the like. Preferred anions of this type include those represented by the formula $(R_fSO_2)_3C^-$, wherein $R_f$ is a perfluoroalkyl radical having from 1 to about 4 carbon atoms.

Illustrative, but not limiting, examples of suitable boron-centered anions include $F_4B^-$, $(3,5\text{-bis}(CF_3)C_6H_3)_4B^-$, $(C_6F_5)_4B^-$, $(p\text{-}CF_3C_6H_4B^-$, $(m\text{-}CF_3C_6H_4)_4B^-$, $(p\text{-}FC_6H_4)_4B^-$, $(C_6F_5)_3(CH_3)B^-$, $(C_6F_5)_3(n\text{-}C_4H_9)B^-$, $(p\text{-}CH_3C_6H_4)_3(C_6F_5)B^-$, $(C_6F_5)_3FB^-$, $(C_6H_5)_3(C_6F_5)B^-$, $(CH_3)_2(p\text{-}CF_3C_6H_4)_2B^-$, $(C_6F_5)_3(n\text{-}C_{18}H_{37}O)B^-$, and the like. Preferred boron-centered anions generally contain 3 or more halogen-substituted aromatic hydrocarbon radicals attached to boron, with fluorine being the most preferred halogen. Illustrative, but not limiting, examples of the preferred anions include $(3,5\text{-bis}(CF_3)C_6H_3)_4B^-$, $(C_6F_5)_4B^-$, $(C_6F_5)_3(n\text{-}C_4H_9)B^-$, $(C_6F_5)_3FB^-$, and $(C_6F_5)_3(CH_3)B^-$.

Suitable anions containing other metal or metalloid centers include, for example, $(3,5\text{-bis}(CF_3)C_6H_3)_4Al^-$, $(C_6F_5)_4Al^-$, $(C_6F_5)_2F_4P^-$, $(C_6F_5)F_5P^-$, $F_6P^-$, $(C_6F_5)F_5Sb^-$, $F_6Sb^-$, $(HO)F_5Sb^-$, and $F_6As^-$. The foregoing lists are not intended to be exhaustive, as other useful boron-centered nonnucleophilic salts, as well as other useful anions containing other metals or metalloids, will be readily apparent (from the foregoing general formulas) to those skilled in the art.

Preferably, the anion, $X^-$, is selected from tetrafluoroborate, hexafluorophosphate, hexafluoroarsenate, hexafluoroantimonate, and hydroxypentafluoroantimonate (for example, for use with cationically-reactive species such as epoxy resins).

Examples of suitable sulfonium salt photoinitiators include:
triphenylsulfonium tetrafluoroborate;
methyldiphenylsulfonium tetrafluoroborate;
dimethylphenylsulfonium hexafluorophosphate;
triphenylsulfonium hexafluorophosphate;
triphenylsulfonium hexafluoroantimonate;
diphenylnaphthylsulfonium hexafluoroarsenate;
tritolysulfonium hexafluorophosphate;
anisyldiphenylsulfonium hexafluoroantimonate;
4-butoxyphenyldiphenylsulfonium tetrafluoroborate;
4-chlorophenyldiphenylsulfonium hexafluorophosphate;
tri(4-phenoxyphenyl)sulfonium hexafluorophosphate;
di(4-ethoxyphenyl)methylsulfonium hexafluoroarsenate;
4-acetonylphenyldiphenylsulfonium tetrafluoroborate;
4-thiomethoxyphenyldiphenylsulfonium hexafluorophosphate;
di(methoxysulfonylphenyl)methylsulfonium hexafluoroantimonate;
di(nitrophenyl)phenylsulfonium hexafluoroantimonate;
di(carbomethoxyphenyl)methylsulfonium hexafluorophosphate;
4-acetamidophenyldiphenylsulfonium tetrafluoroborate;
dimethylnaphthylsulfonium hexafluorophosphate;
trifluoromethyldiphenylsulfonium tetrafluoroborate;
p-(phenylthiophenyl)diphenylsulfonium hexafluoroantimonate;
10-methylphenoxanthenium hexafluorophosphate;
5-methylthianthrenium hexafluorophosphate;
10-phenyl-9,9-dimethylthioxanthenium hexafluorophosphate;
10-phenyl-9-oxothioxanthrenium tetrafluoroborate;
5-methyl-10-oxothianthrenium tetrafluoroborate;
5-methyl-10,10-dioxothianthrenium hexafluorophosphate;

Preferred sulfonium salts include triaryl-substituted salts such as triarylsulfonium hexafluoroantimonate (for example, SARCAT SR1010 available from Sartomer Company), triarylsulfonium hexafluorophosphate (for example, SARCAT SR 1011 available from Sartomer Company), and triarylsulfonium hexafluorophosphate (for example, SARCAT K185 available from Sartomer Company).

Useful azinium salts include those described in U.S. Pat. No. 4,859,572 (Farid et al.) at column 8, line 51, through column 9, line 46, which include an azinium moiety, such as a pyridinium, diazinium, or triazinium moiety. The azinium moiety can include one or more aromatic rings, typically carbocyclic aromatic rings (for example, quinolinium, isoquinolinium, benzodiazinium, and naphthodiazonium moieties), fused with an azinium ring. A quaternizing substituent of a nitrogen atom in the azinium ring can be released as a free radical upon electron transfer from the electronic excited state of the photosensitizer to the azinium photoinitiator. In one preferred form, the quaternizing substituent is an oxy substituent. The oxy substituent, —O-T, which quaternizes a ring nitrogen atom of the azinium moiety can be selected from among a variety of synthetically convenient oxy substituents. The moiety T can, for example, be an alkyl radical, such as methyl, ethyl, butyl, and so forth. The alkyl radical can be substituted. For example, aralkyl (for example, benzyl and phenethyl) and sulfoalkyl (for example, sulfomethyl) radicals can be useful. In another form, T can be an acyl radical, such as an —OC(O)-$T^1$ radical, where $T^1$ can be any of the various alkyl and aralkyl radicals described above. In addition, $T^1$ can be an aryl radical, such as phenyl or naphthyl. The aryl radical can in turn be substituted. For example, $T^1$ can be a tolyl or xylyl radical. T typically contains from 1 to about 18 carbon atoms, with alkyl moieties in each instance above preferably being lower alkyl moieties and aryl moieties in each instance preferably containing about 6 to about 10 carbon atoms. Highest activity levels have been realized when the oxy substituent, —O-T, contains 1 or 2 carbon atoms. The azinium nuclei need include no substituent other than the quaternizing substituent. However, the presence of other substituents is not detrimental to the activity of these photoinitiators.

Useful triarylimidazolyl dimers include those described in U.S. Pat. No. 4,963,471 (Trout et al.) at column 8, lines 18–28. These dimers include, for example, 2-(o-chlorophenyl)-4,5-bis(m-methoxyphenyl)-1,1'-biumidazole; 2,2'-bis(o-chlorophenyl)-4,4',5,5'-tetraphenyl-1,1'-biimidazole; and 2,5-bis(o-chlorophenyl)-4-[3,4-dimethoxyphenyl]-1,1'-biimidazole.

Preferred photoinitiators include iodonium salts (more preferably, aryliodonium salts), chloromethylated triazines, triarylimidazolyl dimers (more preferably, 2,4,5-triphenylimidazolyl dimers), sulfonium salts, and diazonium salts. More preferred are aryliodonium salts, chloromethylated triazines, and the 2,4,5-triphenylimidazolyl dimers (with aryliodonium salts and the triazines being most preferred).

Inorganic Particles

Particles suitable for use in the compositions of the invention are submicron in size, substantially inorganic in chemical composition, and largely transparent at the wavelength of light used for photopolymerization of the organic/inorganic hybrid resin. Such particles include but are not limited to metal oxides such as $Al_2O_3$, $ZrO_2$, $TiO_2$, $ZnO$, and $SiO_2$, as well as other sufficiently transparent non-oxide ceramic materials. An additional consideration in choosing the inorganic particle(s) is the temperature at which the material can be sintered into a dense inorganic structure. Preferably, the particles are substantially spherical.

Colloidal silica is the preferred particle for use in the invention, but other colloidal metal oxides (e.g. titania, alumina, zirconia, vanadia, antimony oxide, tin oxide, and mixtures thereof) can also be utilized. The colloidal particles can include essentially a single oxide with sufficient transparency, such as silica, or can include a core of an oxide of one type (or a core of a material other than a metal oxide) on which is deposited an oxide of another type, preferentially silica. Alternatively they can be composed of clusters of smaller particles. Generally, the particles or clusters are smaller than the wavelength of light used for photopatterning the composition and can range in size (average particle diameter) from about 1 nanometer to about 1 micron, preferably from about 5 nanometers to about 300 nanometers, more preferably from about 10 nanometers to about 150 nanometers. Incorporation of colloidal particles having the specified size range into the photoreactive composition yields a substantially clear, homogeneous composition. Such compositions minimize scattering of light during the photopatterning process, allowing for the preparation of structures having a resolution of less than 1 micron. In addition to the transparent inorganic particles, small amounts of other types of particles can be added to the compositions in order to impart additional properties and or function to the fabricated structure. Such particles include, but are not limited to, absorbing particles and particles with magnetic, piezoelectric, biocompatible ferroelectric, fluorescent and luminescent properties.

It is preferable that the colloidal particles be relatively uniform in size and remain substantially non-aggregated, as particle aggregation can result in precipitation, gellation, or a dramatic increase in sol viscosity. Photoreactive compositions including particles having a substantially monodisperse or a substantially bimodal size distribution are preferred. Thus, a particularly desirable class of particles for use in preparing the compositions of the invention includes, sols of substantially spherical inorganic particles (e.g., colloidal dispersions of substantially spherical inorganic particles in liquid media), especially sols of amorphous silica. Such sols can be prepared by a variety of techniques and in a variety of forms, which include hydrosols (where water serves as the liquid medium), organosols (where organic liquids are used), and mixed sols (where the liquid medium includes both water and an organic liquid). See, e.g., the descriptions of the techniques and forms given in U.S. Pat. No. 2,801,185 (Iler) and U.S. Pat. No. 4,522,958 (Das et al.), which descriptions are incorporated herein by reference, as well as those given by R. K. Iler in The Chemistry of Silica, John Wiley & Sons, New York (1979).

Due to their surface chemistry and commercial availability, silica hydrosols are preferred for use in preparing the compositions of the invention. Such hydrosols are available in a variety of particle sizes and concentrations from, e.g., Nyacol Products, Inc. in Ashland, Md.; Nalco Chemical Company in Oakbrook, Ill.; and E. I. duPont de Nemours and Company in Wilmington, Del. Concentrations from about 10 to about 50 percent by weight of silica in water are generally useful, with concentrations of from about 30 to about 50 weight percent being preferred (as there is less water to be removed). If desired, silica hydrosols can be prepared, for example, by partially neutralizing an aqueous solution of an alkali metal silicate with acid to a pH of about 8 or 9 (such that the resulting sodium content of the solution is less than about 1 percent by weight based on sodium oxide). Other methods of preparing silica hydrosols, e.g., electrodialysis, ion exchange of sodium silicate, hydrolysis of silicon compounds, and dissolution of elemental silicon are described by Iler, supra.

Preparation of a reactive resin sol generally requires that at least a portion of the surface of the inorganic particles be modified so as to aid in the dispersibility of the particles in the resin. This surface modification can be effected by various different methods which are known in the art. (See, e.g., the surface modification techniques described in U.S. Pat. No. 2,801,185 (Iler) and U.S. Pat. No. 4,522,958 (Das et al.), which descriptions are incorporated herein by reference).

For example, silica particles can be treated with monohydric alcohols, polyols, or mixtures thereof (preferably, a saturated primary alcohol) under conditions such that silanol groups on the surface of the particles chemically bond with hydroxyl groups to produce surface-bonded ester groups. The surface of silica (or other metal oxide) particles can also be treated with organosilanes, e.g, alkyl chlorosilanes, trialkoxy arylsilanes, or trialkoxy alkylsilanes, or with other chemical compounds, e.g., organotitanates, which are capable of attaching to the surface of the particles by a chemical bond (covalent or ionic) or by a strong physical bond, and which are chemically compatible with the chosen resin(s). Treatment with organosilanes is generally preferred. When aromatic ring-containing epoxy resins are utilized, surface treatment agents which also contain at least one aromatic ring are generally compatible with the resin and are thus preferred. Similarly, other metal oxides can be treated with organic acid (for example, oleic acid), or the organic acid can be incorporated into the composition as a dispersant.

In preparing the reactive resin sol, a hydrosol (e.g., a silica hydrosol) can generally be combined with a water-miscible organic liquid (e.g., an alcohol, ether, amide, ketone, or nitrile) and, optionally (if alcohol is used as the organic liquid), a surface treatment agent such as an organosilane or organotitanate. Alcohol and/or the surface treatment agent can generally be used in an amount such that at least a portion of the surface of the particles is modified sufficiently to enable the formation of a stable reactive resin sol (upon combination with reactive resin). Preferably, the amount of alcohol and/or treatment agent is selected so as to provide particles which are at least about 50 weight percent metal oxide (e.g., silica), more preferably, at least about 75 weight percent metal oxide. (Alcohol can be added in an amount sufficient for the alcohol to serve as both diluent and treatment agent.) The resulting mixture can then be heated to remove water by distillation or by azeotropic distillation and can then be maintained at a temperature of, e.g., about 100° C. for a period of, e.g., about 24 hours to enable the reaction (or other interaction) of the alcohol and/or other surface treatment agent with chemical groups on the surface of the particles. This provides an organosol comprising particles which have surface-attached or surface-bonded organic groups (also referred to herein as "substantially inorganic" particles).

The resulting organosol can then be combined with a reactive resin and the organic liquid removed by, e.g., using a rotary evaporator. Preferably, the organic liquid is removed by heating under vacuum to a temperature sufficient to remove even tightly-bound volatile components. Stripping times and temperatures can generally be selected so as to maximize removal of volatiles while minimizing advancement of the resin.

Preparation of Photoreactive Composition

The curable and optionally non-curable species, inorganic particles and components of the photoinitiator system can be prepared by the methods described above or by other methods known in the art. These components can be combined under "safe light" conditions using any order and manner of combination (optionally, with stirring or agitation), although it is sometimes preferable (from a shelf life and thermal stability standpoint) to add the electron acceptor last (and after any heating step that is optionally used to facilitate dissolution of other components). Solvent can be used, if desired, provided that the solvent is chosen so as to not react appreciably with the components of the composition. Suitable solvents include but are not limited to, for example, methyl isobutyl ketone, dichloroethane, propylene glycol methyl ether acetate, acetonitrile, and tetrahydrofuran. The reactive species itself can also sometimes serve as a solvent for the other components.

The photoreactive composition has a viscosity that is generally greater than about 15,000 centipoise at room temperature and a shear rate of 1 hertz, facilitating controlled application of the composition to a substrate.

The components of the photoinitiator system are present in photochemically effective amounts (as defined above). Generally, the organic fraction of the photoreactive resin composition contains from about 5% to about 99.79% by weight of one or more reactive species (preferably, from about 10% to about 99.79%; more preferably, from about 20% to about 99.79%); from about 0.01% to about 10% by weight of one or more photosensitizers (preferably, from about 0.1% to about 5%; more preferably, from about 0.2% to about 2%); up to about 10% by weight of one or more electron donor compounds (preferably, from about 0.1% to about 10%; more preferably, from about 0.1% to about 5%); and from about 0.1% to about 10% by weight of one or more electron acceptors (preferably, from about 0.1% to about 5%) based upon the total weight of solids in the composition (that is, the total weight of components other than solvent). In the case of silica, the inorganic particles generally represent about 20% to 80% by weight of the polymer composition, preferably about 50% to 70% by weight of the composition, and can constitute up to 65% by volume of the composition. The polymeric component (i.e., reactive species) typically represents about 30% to about 50% by weight. However, suitable adjustments in these ranges will be required for inorganic particles with varying densities.

A variety of other materials can be added to the photoreactive compositions depending upon the desired end use of the photodefined inorganic structure or the desired physical properties of the photoreactive resin prior to photopatterning. Such materials could include but are not limited to, solvents, diluents, dyes, organometallic precursors, and thixotropic agents. Some dopants can also be added to the porous inorganic structure formed from pyrolysis of the patterned organic/inorganic nanocomposite by filling in the void volume of the structure.

The amounts and types of such added materials and the manner in which they are added will be evident to those skilled in the art. It is within the scope of this invention to include non-reactive polymeric binders in the compositions in order, for example, to control viscosity and to provide film-forming properties. Such polymeric binders can generally be chosen to be compatible with the reactive species. For example, polymeric binders that are soluble in the same solvent that is used for the reactive species, and that are free of functional groups that can adversely affect the course of reaction of the reactive species, can be utilized. Binders can be of a molecular weight suitable to achieve desired film-forming properties and solution rheology (for example, molecular weights between about 5,000 and 1,000,000 daltons; preferably between about 10,000 and 500,000 daltons; more preferably, between about 15,000 and 250,000 daltons). Suitable polymeric binders include, for example, polystyrene, poly(methyl methacrylate), poly(styrene)-co-(acrylonitrile), cellulose acetate butyrate, and the like. Suitable nonreactive polymeric binders, if present, can be included in the compositions up to 20%; preferably up to 10%; more preferably up to 5% by weight of the total composition.

EXAMPLES

Unless otherwise noted, chemicals used in the examples were commercially available from Aldrich Chemical Co., Milwaukee, Wis. Borate salt was commercially available from Ciba Specialty Chemicals, Tarrytown, N.Y. under the trade designation CGI 7460. Diaryliodonium hexafluoroantimonate salt was commercially available from Sartomer Company, West Chester, Pa. under the trade designation CD1012.

Preparatory Example 1

The sensitizing dye, bis-[4-(diphenylamino)stryl]-1-(2-ethylhexyloxy),4-(methoxy)benzene was prepared as follows:

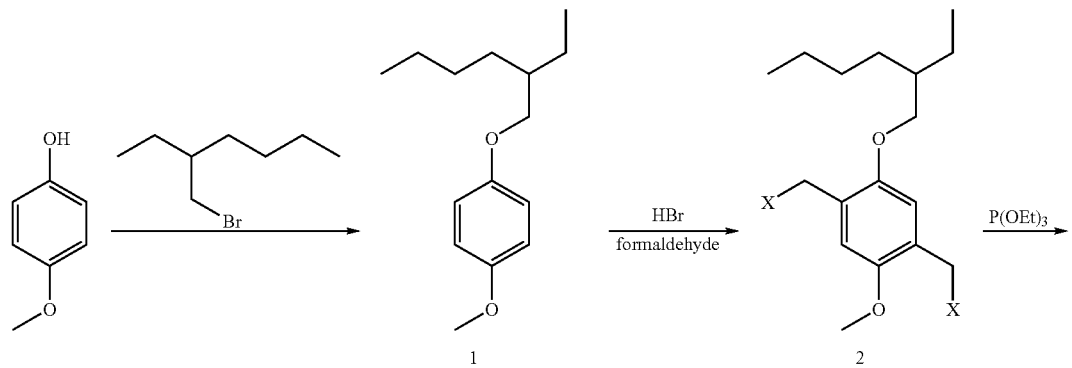

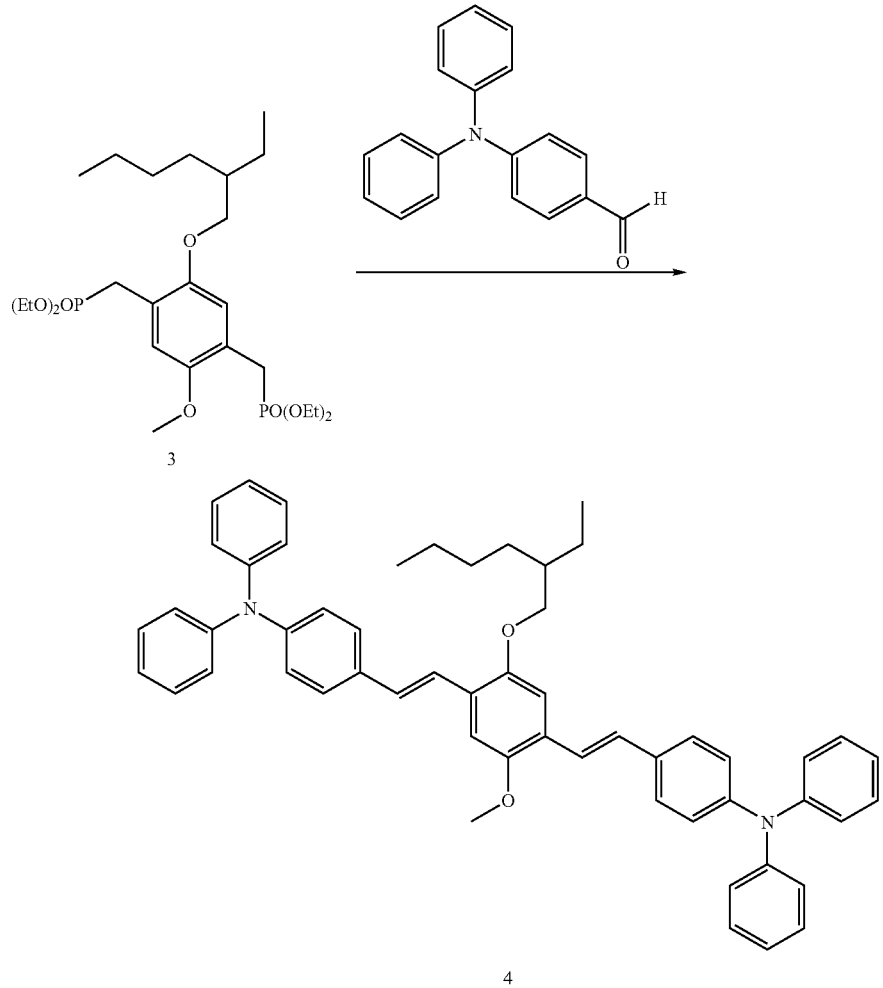

1-methoxy-4-(2-ethylhexyloxy)benzene (1)

A mixture of 4-methoxyphenol (100.0 g, 0.8 mol), dry potassium carbonate (166.7 g, 1.2 mol), acetonitrile (800 mL), and 2-ethylhexyl bromide (173.8 g, 0.9 mol) was stirred mechanically and heated at reflux for 4 days. After cooling, the mixture was diluted with water (1.5 L), and then the organic phase was separated. The aqueous layer was extracted with hexane, and the combined organic layers were washed two times with 1.0 M NaOH and water. After drying over $MgSO_4$, the solvent was removed under reduced pressure to give an orange oil. The crude product was distilled under reduced pressure to give 152 g (80%) of a clear oil. (bp 135–138° C. at 0.4 mmHg).

2,5-bis(bromomethyl)-1-methoxy-4-(2-ethylhexyloxy)benzene (2)

A mixture of 1-methoxy-4-(2-ethylhexyloxy)benzene (50.0 g, 0.21 mol), paraformaldehyde (30.0 g, 1 mol), acetic acid (100 mL), and HBr (30% in acetic acid, 100 mL) was heated to 70° C. The reaction exothermed to 80° C. and the paraformaldehyde dissolved completely to give an orange solution. After 4 h at 70° C., the reaction was cooled to room temperature. The mixture was diluted with methylene chloride (500 mL), and the organic layer was washed three times with water and once with saturated $NaHCO_3$. After drying over $MgSO_4$, the solvent was removed under vacuum. A pale yellow solid was obtained which was recrystallized from hexane to give a yellow/white powder (71.6 g, 81%). Alternatively: 2,5-bis(choloromethyl)-1-methoxy-4-(2-ethylhexyloxy)benzene can be synthesized according to procedures in U.S. Pat. No. 5,189,136.

Phosphine Derivative (3)

A mixture of 2,5-bis(choloromethyl)-1-methoxy-4-(2-ethylhexyloxy)benzene (28.26 g, 85 mmol) and triethyl phosphite (37.4 g, 0.23 mol) was heated to reflux for 6 h. After cooling, the product was heated under high vacuum to remove residual triethylphosphite. A thick oil was obtained which slowly crystallized after several days and used in the following step without further purification.

Bis-[4-(diphenylamino)stryl]-1-(2-ethylhexyloxy),4-(methoxy)benzene (4)

To a mixture of phosphine derivative (3) (11.60 g, 21.7 mmol), 4-diphenylaminobenzaldehyde (12.34 g, 45.1 mmol), and dry tetrahydrofuran (400 mL) was added dropwise potassium t-butoxide (1.0 M in tetrahydrofuran, 44 mL, 44 mmol). The mixture was stirred for 3 hours at room temperature, then the solvent was removed under vacuum. Water (100 mL) was added to the residue, and the mixture was extracted several times with methylene chloride. The combined organic layers were washed with brine, dried over MgSO$_4$ and the solvent was removed under vacuum. The crude product was purified by column chromatography on silica gel using 30/70 methylene chloride/hexane to give a bright green solid (14.44 g, 86%).

Preparatory Example 2

Preparations of silica-epoxy sols containing various sizes of colloidal silica are described.

Formulation A 245 grams of a NALCO 2327 solution (41% silica approximately 20 nm in diameter in an aqueous dispersion from Ondeo Nalco, Bedford Park, Ill.) was placed in a round bottom flask and under medium agitation. A premixed solution of 500 grams of 1-methoxy-2-propanol and 12.34 grams of trimethoxyphenylsilane (0.62 mmoles of silane per gram of silica) was added over a period of 5–10 minutes. The resulting non-agglomerated solution was heated at 90–95° C. for approximately 22 hours and then dried to yield a white powder. The treated silica was added to de-ionized water (100 grams of silica to 300 grams of water) and vigorously stirred for 3–4 hours, and then allowed to sit at room temperature overnight. The silica was filtered off, washed well with additional rinses of de-ionized water and dried.

The treated silica was dispersed in acetone (20–25% solids) using a high shear Silverson LMR mixer set at ¾ speed for 5 minutes. The resulting dispersion was covered and allowed to sit for a minimum of two hours. The dispersion was filtered through 1 micron Gelman acrodisc 25 mm glass fiber syringe filters, and the percent silica solids was determined. A sample of the above silica/acetone mixture containing 10 grams of treated silica solids by weight was added to 4.87 grams of ERL 4221E (DOW Chemical, Midland, Mich.), mixed well and vacuum stripped while slowly heating using a rotary evaporator and oil bath and maintained at a final stripping temperature of 130° C. for 30 minutes. 14.87 grams of this mixture was placed in a 20 gram speed mix cup along with 0.26 grams of 1,4-butanediol (Aldrich Chemical Co.) and 1.54 grams of distilled HELOXY 107 (Shell Chemical, Houston, Tex.) and mixed for ten minutes at 3000 rpms using a FlackTek Inc. DAC 150 FVZ speed mixer to give a silica-epoxy sol containing 60% silica by weight.

Formulation B 200 grams of a Nalco TX 11005 (lot XC1H0202A1) solution (31% 123 nm silica particles in an aqueous dispersion from Ondeo Nalco) was placed in a round bottom flask and under medium agitation, a premixed solution of 400 grams of 1-methoxy-2-propanol and 1.35 grams of trimethoxyphenylsilane (0.11 mmoles of silane per gram of silica) was added over 5–10 minutes. The resulting non-agglomerated solution was heated at 90–95° C. for approximately 22 hours and then dried to yield a white powder. The treated silica was added to de-ionized water (100 grams of silica to 300 grams of water) and vigorously stirred for 3–4 hours, then allowed to sit at room temperature overnight. The silica was filtered off, washed well with additional rinses of de-ionized water and dried.

The treated silica was dispersed in acetone (20–25% solids) using a high shear Silverson L4R mixer set at ¾ speed for 5 minutes. The resulting dispersion was covered and allowed to sit for a minimum of two hours, at which point it was filtered through 1 micron Gelman acrodisc 25 mm glass fiber syringe filters and percent silica solids determined.

A sample of the above silica/acetone mixture containing 10 grams of treated silica solids was added to 4.87 grams of ERL 4221e(DOW Chemical), mixed well and vacuum stripped while slowly heating using a rotary evaporator and oil bath. Final stripping temperature was 130° C. for 30 minutes. 14.87 grams of this mixture was placed in a 20 gram speed mix cup along with 0.26 grams of 1,4-butanediol (Aldrich) and 1.54 grams of Heloxy 107(Shell Chemical-distilled by SMMD/3M) mixed for ten minutes at 3000 rpms using a FlackTek Inc. DAC 150 FVZ speed mixer. A silica-epoxy sol containing 60% treated nanosilica, by weight resulted.

Formulation C 100 grams of a 20.6% aqueous dispersion of approximately 550 nm silica (Catalyst and Chemical Ind. Co. LTD, Horikawa-Cho, Japan) were placed in a round bottom flask. 200 grams of 1-methoxy-2-propanol were added under medium agitation, followed by the dropwise addition of aqueous ammonium hydroxide until the pH was between 8–9. Once the pH reached 8–9, the solution was allowed to react at 60° C. for one hour. 0.41 grams of trimethoxyphenylsilane (0.1 mmoles per gram of silica) were added. The solution was heated to 90° C. and reacted for approximately 22 hours. The reaction solution was cooled to room temperature, bottled, and percent solids were determined.

A sample of the above treated nanosilica solution containing 10 grams of treated silica solids was added to 4.87 grams of ERL 4221E, mixed well and vacuum stripped while slowly heating using a rotary evaporator and oil bath. Final stripping temperature was 130° C. for 30 minutes. 14.87 grams of this mixture was placed in a 20 gram speed mix cup along with 0.26 grams of 1,4-butanediol (Aldrich) and 1.54 grams of distilled HELOXY 107 and mixed for ten minutes at 3000 rpms using a FlackTek Inc. DAC 150 FVZ speed mixer yielding a silica-epoxy sol containing 60% by weight treated silica.

Formulation D 100 grams of SILSTAR LE-05S (4.5±0.5 microns; max particle size of approximately 20 microns) were placed in a round bottom flask and under medium agitation 100 grams of 1-methoxy-2-propanol and 100 grams of de-ionized water were added, followed by the dropwise addition of aqueous ammonium hydroxide until the pH was between 8–9. Once the pH reached 8–9, the solution was allowed to react at 60° C. for one hour. 1.984 grams of trimethoxyphenylsilane (0.1 mmoles silane per gram of silica) were added. The solution was heated to 90° C. and reacted for approximately 22 hours. The treated silica was filtered off, rinsed with 200 grams of de-ionized water, air dried for 5 hours, and then vacuum dried for three hours at 100° C.

10 grams of the above dried powder was placed into a mixture of 4.87 grams of ERL-4221e, 0.26 grams of 1,4-butanediol, and 1.54 grams of HELOXY 107 (Shell Chemical; SMMD/3M distilled). The mixture was high shear mixed for five minutes at 300 rpm using a FlackTek Inc. DAC 150 FVZ speed mixer yielding a silica-epoxy sol containing 60% by weight treated silica.

Formulation E 900 grams of a Nalco 2327 solution (41.8% silica in an aqueous dispersion from Ondeo Nalco) were placed in a 2 liter beaker and, under medium agitation, prewashed Amberlite IR-120 plus ion exchange resin was slowly added until the pH measured between 2–3 (using COLORPHAST pH paper). After stirring for 30 minutes at room temperature, the solution was filtered through 10 micron nylon mesh fabric to remove the ion exchange resin and solids were determined (41.6%). 800 grams of the ion exchanged Nalco 2327 solution was placed in a round bottom flask and under medium agitation, 230 grams of deionized water (the addition of the water prevents agglomeration of the sol as the pH is raised) were added followed by a dropwise addition of aqueous ammonium hydroxide to bring the pH to between 8–9. To this was added a premixed solution of 1600 grams of 1-methoxy-2-propanol and 40.92 grams of trimethoxyphenylsilane (0.62 mmoles of silane per gram of silica) over 5–10 minutes. The resulting non-agglomerated solution was heated at 90–95° C. for approximately 22 hours. Silica solids of the solution were determined to be 15.4% by weight. 390 grams of the silica solution was added to 36.0 grams of ERL 4221E (DOW Chemical), mixed well and vacuum stripped while slowly heating using a rotary evaporator with aspirator and oil bath. Final stripping temperature (using a vacuum pump) was 130° C. for 45 minutes. 96 grams of this mixture was placed in a 100 gram speed mix cup along with 4.0 grams of 1,5-pentanediol (Aldrich), mixed for ten minutes at 3000 rpms using a FlackTek Inc. DAC 150 FVZ speed mixer. A silica-epoxy sol containing 60% treated nanosilica, by weight resulted.

Formulation F 245 grams of a Nalco 2327 solution (41% 20 nm silica particles in an aqueous dispersion from Ondeo Nalco) was placed in a round bottom flask and under medium agitation, a premixed solution of 500 grams of 1-methoxy-2-propanol and 15.47 grams of 3-(trimethoxysilyl)propylmethacrylate (Aldrich) (0.62 mmoles of silane per gram of silica)was added over 5–10 minutes. The resulting non-agglomerated solution was heated at 85–90° C. for approximately 20 hours and then air dried to yield a white powder. The treated silica was added to de-ionized water (100 grams of silica to 300 grams of water) and vigorously stirred for 3–4 hours, then allowed to sit at room temperature overnight. The silica was filtered off, washed well with additional rinses of de-ionized water and dried.

The treated silica was dispersed in acetone (20–25% solids) using a high shear Silverson LMR mixer set at ¾ speed for 5 minutes. The resulting dispersion was covered and allowed to sit for a minimum of two hours, at which point it was filtered through 1 micron Gelman acrodisc 25 mm glass fiber syringe filters and the percent silica solids determined. A sample of the above treated nanosilica/acetone mixture containing 10 grams of treated silica solids was added to 2.67 grams of bisphenol-A-bis-(3-methacrylato-2-hydroxypropyl) ether (bisGMA, available from Aldrich Chemical Co., Milwaukee, Wis.) and stripped at 60° C. on a Buchi rotary evaporator using a water aspirator and oil bath until roughly 90% of the acetone had been removed. 4 grams of triethyleneglycol dimethacrylate (TEGDMA; also available from Aldrich Chemical Co.) were added, mixture was heated to 85° C. and aspirator stripping continued for 30 minutes.

Any remaining acetone was removed by switching from the aspirator to a vacuum pump and stripping at 85° C. for 10 minutes. The resulting mixture was speed mixed for ten minutes at 3000 rpms using a FlackTek Inc. DAC 150 FVZ speed mixer. A silica-methacrylate resin sol containing 60% treated nanosilica, by weight resulted.

Example 3

This example describes photopatterning of a silica-epoxy sol containing 20 nm colloidal silica. Silicon wafers were cleaned by soaking them for 10 minutes in a 3:1 mixture of sulfuric acid (98% solution in $H_2O$) and hydrogen peroxide (30% solution in $H_2O$), rinsed thoroughly with deionized water, rinsed with isopropanol and then dried. To promote adhesion of the resin to the substrate, the wafers were treated with an epoxy-silane coupling agent. A 2% by weight of 2-(3,4 epoxycyclohexyl)-ethyl trimethoxysilane (Gelest, Tullytown, Pa.) solution in slightly acidic (pH 4–5) aqueous ethanol (Aaper, Shelbyville, Ky.) was prepared. The wafers were dip coated in the solution for approximately 60 seconds and briefly rinsed with anhydrous ethanol (EM Science, Gibbstown, N.J.). The primed wafers were then allowed to cure overnight. Working under safe light conditions, a photoinitiator system consisting of 0.6% bis-[4-(diphenylamino)stryl]-1-(2-ethylhexyloxy),4-(methoxy)benzene (from example 1) and 1.0% CD1012 based on the weight of resin solids was pre-dissolved in a small amount of 1:1 ratio of tetrahydrofuran (Burdick & Jackson, Muskegon, Mich.) and 1,2 dichloroethane (EM Science, Gibbstown, N.J.) and added to a known amount of Formulation E. Sufficient additional 1,2-dichloroethane was added to the mixture to reach a final resin solids content of 65% by weight. The resin was then mixed for 2 minutes at 3000 RPM in a FlackTek Inc. DAC 150 FVZ speed mixer. The curable composition was dispensed onto the center of an epoxy/silane treated silicon wafer using a syringe and spin coated at 2700 rpm for 60 seconds. Directly afterwards, the coated silicon wafers were soft baked in an 80° C. oven for thirty minutes to evaporate the residual solvents. The curable composition formed a smooth uniform film approximately 10 microns thick.

The coated samples were photopatterned using a Karl Suss mask aligner having a peak intensity at 368 nm (MJB 3, Karl Suss America, Inc., Waterbury, Vt.). A chrome, dark field mask with 10 μm wide lines was used. The photopatterning conditions included an exposure time of 25 seconds, followed by a five minute post-exposure bake at 110° C. on a hot plate. Finally, the films were developed for 25 seconds in propylene glycol methyl ether acetate (PGMEA), rinsed in isopropyl alcohol, and air dried. Examination using a scanning electron microscope (SEM) showed that the photopatterned lines were approximately 10±0.4 microns tall and 10 microns wide. The top surface was slightly smoother than the side walls. One of the photopatterned lines is shown in FIG. 2.

Example 4

Slides with patterned organic/inorganic nanocomposite waveguides on silicon measuring 10 microns wide by approximately 10 microns thick were prepared using the same epoxy resin system described in Example 3, Formulation E. The samples were then heated at 1° C. minute to 700° C. for 2 hours in a Vulcan furnace (Model #3-350, Degussa-Ney, Bloomfield, Conn.). The furnace then was allowed to slow cool to room temperature. Inspection of the waveguides after removal from the furnace under an optical microscope revealed no new breaks in the pyrolyzed waveguides. One of the samples was removed and lightly sputter coated with AuPd for examination using the SEM. The microscopy results indicated that the patterned lines had decreased in both height and width by approximately 19%. Good adhesion to the silicon wafers was observed. Pore sizes in the range of 2–60 nm were observed.

The remaining patterned samples were cleaved and divided into five pieces. One piece was set aside for comparison with the sintered samples. The other four samples were treated with varying concentrations of boric acid dissolved in methanol, 0.0 M, 0.05 M, 0.10 M, and 1.0 M boric acid in methanol respectively. The samples were immersed into the boric acid solutions for 1 minute and then rinsed quickly with fresh methanol. The samples were blown dry with stream of dry, filtered compressed nitrogen. The three boric acid treated samples and control sample (0.0 M boric acid in methanol) were then sintered in a quartz tube furnace using the following conditions: heat from 50° C. to 100° C. over 30 minutes; hold at 100° C. for 30 minutes; heat from 100° C. to 600° C. over 30 minutes; hold at 600° C. for 1 hour; heat from 600° C. to 1000° C. over 1 hour; hold at 1000° C. for 6 hours; and cool from 1000° C. to 50° C. over 6.5 hours. The samples were removed from the furnace and inspected under the optical microscope confirming no new breaks in the waveguide lines.

Example 5

This example describes the production of nanocomposite films of various thicknesses, which are photopatterned and pyrolyzed.

Fused silica substrates were cleaned by soaking them for 10 minutes in a 3:1 mixture of sulfuric acid (98% solution in H$_2$O) and hydrogen peroxide (30% solution in H$_2$O), rinsed thoroughly with deionized water, rinsed with isopropanol and then dried. To promote adhesion of the resin to the substrate, the fused silica substrates were treated with an epoxy-silane coupling agent. A 2% by weight of 2-(3,4 epoxycyclohexyl)-ethyl trimethoxysilane (Gelest,Tullytown, Pa.) solution in slightly acidic (pH 4–5) aqueous ethanol (Aaper, Shelbyville, Ky.) was prepared. The fused silica substrates were dip coated in the solution for approximately 60 seconds and briefly rinsed with anhydrous ethanol (EM Science, Gibbstown, N.J.). The primed substrates were then allowed to cure overnight at room temperature.

Working under safe light conditions, three different solutions were prepared, spin coated, and exposed as described in Table 1. Formulation A from Preparatory Example 2 was used as the resin. Samples E1 and E2 were soft baked for 10–15 minutes in an 80° C. oven. Sample E3 was soft baked for 50 minutes in an 80° C. oven. A chrome dark field mask with 200 micron wide lines was used in soft contact mode for exposure. The exposure times were increased with increasing film thickness to ensure that the composition was cured through the full depth. Table 1 indicates the photopatterning conditions used for each sample. All samples underwent a five minute post-exposure bake on a 110° C. hot plate prior to development using PGMEA.

TABLE 1

Photopatterning conditions for Example 5

| Sample | Solids Content | Wt % dye | Wt % CD1012 | Spin Speed (RPM) | Exposure Time (s) | Thickness (microns) |
| --- | --- | --- | --- | --- | --- | --- |
| E1 | 65% | 0.5 | 1.0 | 4000 | 25 | 10 |
| E2 | 75% | 0.5 | 1.0 | 4000 | 40 | 18.5 |
| E3 | 78% | 0.25 | 1.0 | 2000 | 85 | 34 |

Following photopatterning, the three samples were carefully inspected under an optical microscope so as to distinguish between cracking during sintering and breaks that were present in the original as patterned sample. The samples were then heated at 1° C. minute to 700° C. for 2 hours in a Vulcan furnace (Model #3-350, Degussa-Ney, Bloomfield, Conn.) and then slowly cooled to room temperature. The samples were removed from the furnace and inspected under the optical microscope to look for new breaks in the lines. No new breaks were observed for samples E1 and E2. Sample E3 had many new breaks and there was adhesive failure of the lines to the fused silica substrates.

Example 6

This example describes preparation of a silica/germania waveguide on a fused silica substrate. Fused silica slides with patterned organic/inorganic nanocomposite waveguides measuring 200 microns wide by approximately 10 microns thick were prepared using the same resin and procedure as described for Sample E1 in Example 5. Slides with patterned organic/inorganic nanocomposite waveguides were then heated at 1° C. minute to 700° C. for 2 hours in a Vulcan furnace (Model #3-350, Degussa-Ney, Bloomfield, Conn.) to pyrolyze and remove the organic binder. The samples were slowly cooled to room temperature. Inspection of the waveguides after removal from the furnace under an optical microscope revealed no new breaks in the patterned waveguides.

The nano-porous patterned waveguides were filled by immersing the sample in tetraethylorthogermanium under a nitrogen atmosphere. The sample was allowed to sit in the solution for 1 minute to allow ample time for the tetraethylorthogermanium to fill the pores by capillary action. The excess tetraethylorthogermanium between waveguide lines was removed by a brief rinse with methanol. The sample was then exposed to ammonia vapor for a few minutes to initiate the condensation of the tetraethylorthogermanium. The sample was sintered in a quartz tube furnace using the following conditions: Under a helium atmosphere, heat from 50° C. to 100° C. over 30 minutes hold at 100° C. for 30 minutes, heat from 100° C. to 600° C. over 30 minutes hold a 600° C. for 1 hour, heat from 600° C. to 1000° C. over 1 hour hold at 1000° C. for 6 hours switching from a helium to nitrogen atmosphere after 3 hours at 1000° C., cool to room temperature from 1000° C. over 6.5 hours. Inspection of the waveguides after removal from the furnace under an optical microscope revealed no new breaks in the sintered waveguides. The sample was prepared for optical measurements by polishing the ends of the waveguide to an optical quality finish. The waveguides were tested at 1.5 µm with light from a fiber coupled Amplified Spontaneous Emission (ASE) source. The light from the ASE source was launched into the waveguide by butt-coupling the single-mode output fiber from the ASE source with one end of the waveguide.

An infrared camera was placed behind the other end of the waveguide to image the light emerging from the waveguide. When the system was properly aligned, a far-field pattern of light emitted from the waveguide was observed. The pattern indicated that the waveguide was multi-mode in nature, as would be expected for a waveguide with a 200 micron width.

Example 7

Silicon wafers were cleaned and primed with epoxy-silane coupling agent according to the procedures described in example 3. Working under safe light conditions, a photoinitiator system consisting of 0.6% bis-[4-(diphenylamino)stryl]-1-(2-ethylhexyloxy),4-(methoxy)benzene (from example 1) and 1.0% CD1012 based on the weight of resin solids was pre-dissolved in a small amount of a 1:1 ratio tetrahydrofuran (Burdick & Jackson, Muskegon, Mich.) and 1,2 dichloroethane (EM Science, Gibbstown, N.J.) and added to a known amount of Formulation B. The resin was mixed for 2 minutes at 3000 RPM in a FlackTek Inc. DAC 150 FVZ speed mixer. Sufficient additional 1,2-dichloroethane was then stirred in by hand to reach a final resin solids content of 75% by weight. The curable composition was dispensed onto the center of an epoxy/silane treated silicon wafer using a syringe and spin coated at 3000 rpm for 40 seconds. Directly afterwards, the coated silicon wafers were soft baked in an 80° C. oven for thirty minutes to evaporate the residual solvents. The curable composition formed a smooth uniform film approximately 10 microns thick.

The coated samples were photopatterned using a Karl Suss mask aligner having a peak intensity at 368 nm (MJB 3, Karl Suss America, Inc., Waterbury, Vt.). A chrome, dark field mask with 10 μm wide lines was used. The photopatterning conditions included an exposure time of 75 seconds, followed by 7.5 minute post-exposure bake at 110° C. on a hot plate. Finally, the films were developed for 2.5 minutes in propylene glycol methyl ether acetate (PGMEA), rinsed in isopropyl alcohol, and air dried. Examination using an optical microscope indicated that the photopatterned lines were approximately 10 microns tall and 10 microns wide.

Example 8

This example demonstrates photopatterning of an acrylate/silica sol. Silicon wafers were cleaned by soaking them for 10 minutes in a 3:1 mixture of sulfuric acid (98% solution) and hydrogen peroxide (30% solution in $H_2O$), rinsed thoroughly with deionized water, rinsed with isopropanol and then dried. Cleaned silicon wafers were then dip coated in a 2% by weight solution of 3-(trimethoxysilyl) propyl methacrylate in slightly acidic (pH 4–5) aqueous ethanol (190 proof). The slides were rinsed briefly in anhydrous ethanol and cured for 10 minutes in a 130° C. oven. A portion of the bisGMA/TEGDMA/silica sol (Formulation F) was dissolved in sufficient 4-methyl-2-pentanone to make a solution 75% solids by weight and allowed to stir overnight until a homogenous solution was obtained. Working under safe light conditions, 10 g of this stock solution was mixed with a solution of 0.15 g of CD1012, 0.15 g of CGI 7460, and 0.075 g of Bis-[4-(diphenylamino)stryl]-1-(2-ethylhexyloxy),4-(methoxy)benzene (from example 1) dissolved in 1.25 g tetrahydrofuran (Burdick & Jackson, Muskegon, Mich.). The percent solids content was adjusted to 69.5% by adding the appropriate amount of 4-methyl-2-pentanone. The solution was speed mixed at 1750 rpm for 60 seconds using a FlackTek Inc. 150 FVZ speed mixer and then spin coated on to the treated silicon wafers. The coated wafers were then soft baked at 60° C. for 1 hour and 80° C. for 1 hour to remove the residual solvent. The photoresist layer was approximately 10 microns thick.

Photopatterning was performed using a Karl Suss Mask Aligner (MJB 3, Karl Suss America, Inc., Waterbury, Vt.) operating at a wavelength of 368 nm using a chrome, dark field mask with 10 μm wide lines. The samples were exposed for 45 seconds, and then the unreacted resin was removed by development in 4-methyl-2-pentanone and isopropanol rinse. Examination under an optical microscope indicated that the photopatterned lines were approximately ten microns wide and ten microns thick.

Comparative Example 9

This example describes photopatterning of curable epoxy/silica sols containing 0.5 micron and larger sized colloidal particles.

TABLE 2

Photolithography conditions for Comparative Example 1

| Sample | Formulation | Solids Content (%) | Spin Speed (RPM) | Soft Bake Time (min) | Exposure Time (s) |
|--------|-------------|--------------------|-----------------|---------------------|-------------------|
| CP1    | C           | 75                 | 3000            | 30                  | 20                |
| CP2    | D           | 88                 | 3200            | 45                  | 2.5               |

Working under safe light conditions, a photoinitiator system consisting of 0.6% bis-[4-(diphenylamino)stryl]-1-(2-ethylhexyloxy),4-(methoxy)benzene and 1.0% CD1012 based on the weight of resin solids was pre-dissolved in a small amount of 1:1 ratio tetrahydrofuran (Burdick & Jackson, Muskegon, Mich.) and 1,2 dichloroethane (EM Science, Gibbstown, N.J.) and added to a known amount of Formulations C and D. Additional 1,2 dichloroethane was then stirred in by hand to adjust the final solids to the value indicated in Table 2. The resin was mixed for 90 seconds at 3000 rpm using a high shear Silverson L4R mixer. The curable composition was dispensed onto the center of a clean, epoxy/silane treated silicon wafer (see example 3) using a syringe and spin coated at the speed indicated in Table 2 for 40 seconds. Directly afterwards, the coated silicon wafers were soft baked in an 80° C. oven for the indicated time to evaporate the residual solvents.

The coated films were exposed using the same system as described in Example 3 and using the same chrome dark field mask with 10 micron wide lines. Following a 5 minute post-exposure bake at 110° C. on a hot plate, development in PGMEA, isopropyl alcohol rinse and air dry, the patterned structures were examined using a scanning electron microscope. FIGS. 3A and 4 show the scanning electron micrographs of the nanocomposite ridges photopatterned using formulations C and D respectively. For comparison, FIG. 2 shows photopatterned nanocomposite ridges containing 20 nm silica nanoparticles (prepared in Example 3).

A number of embodiments of the invention have been described. Nevertheless, it will be understood that various modifications can be made without departing from the spirit and scope of the invention. Accordingly, other embodiments are within the scope of the following claims.

What is claimed is:

1. A method for making an inorganic structure comprising:
   (a) applying a photoreactive composition to a substrate, wherein the composition comprises:
       a reactive species,
       a photoinitiator system, and
       a plurality of substantially inorganic colloidal particles, wherein the particles have an average particle size of less than about 300 nm;
   (b) photopatterning the composition to define a structure; and
   (c) subjecting the structure to elevated temperature for a time sufficient to pyrolyze the reactive species and to at least partially fuse the particles.

2. The method of claim 1, wherein the particles are substantially spherical.

3. The method of claim 1, wherein the photopatterning is conducted through a mask.

4. The method of claim 1, wherein the particles are present in the composition at up to about 65% by volume.

5. The method of claim 1, wherein the particles are present in the composition at between about 50% and about 80% by weight.

6. The method of claim 1, wherein step (b) further comprises removing a soluble portion of the composition from the substrate.

7. The method of claim 1, wherein step (c) further comprises subjecting the structure to a temperature of between about 500° C. to about 1400° C. for about 2 hours to about 48 hours.

8. The method of claim 1, wherein the inorganic structure is a planar optical device.

9. The method of claim 1, wherein the inorganic structure is a planar optical device which functions as a sensor.

10. The method of claim 1, wherein the viscosity of the photocurable composition is greater than 15,000 centipoise at room temperature and a shear rate of 1 Hz.

11. The method of claim 1, wherein the particles are substantially monodisperse in size.

12. The method of claim 1, wherein the particles are substantially bimodal in size distribution.

13. The method of claim 1, wherein the particles are surface treated.

14. The method of claim 1, wherein the particles comprise surface attached organic groups.

15. The method of claim 13, wherein the surface treatment method is selected from the group consisting of silanization, plasma treatment, organic acid treatment, Corona treatment, hydrolysis, coating, and titanation.

16. The method of claim 1, wherein the reactive species is selected from the group consisting of acrylates, methacrylates, vinylates, epoxies, vinyl ethers, cyanate esters, and copolymers and blends thereof.

17. The method of claim 1, wherein the photoinitiator system comprises free-radical or cationic photoinitiators, and combinations thereof.

18. The method of claim 17, wherein the cationic photoinitiator is selected from the group consisting of iodonium salts, chloromethylated triazines, diazonium salts, sulfonium salts, azinium salts, triarylimidazolyl dimers, and mixtures thereof.

19. The method of claim 17, wherein the free-radical photoinitiator is selected from the group consisting of acetophenones, benzophenones, aryl glyoxalates, acylphosphine oxides, benzoin ethers, benzil ketals, thioxanthones, aromatic sulfonyl chlorides, photoactive oximes, nitroso compounds, acyl halides, hydrozones, chloroalkyltriazines, bisimidazoles, triacylimidazoles, pyrylium compounds, sulfonium and iodonium salts, mercapto compounds, quinones, azo compounds, and organic peroxides.

20. The method of claim 17, wherein the photoinitiator system further comprises a photosensitizer and an electron donor compound.

21. The method of claim 1, wherein the colloidal particles comprise a metal oxide.

22. The method of claim 21, wherein the metal oxide is selected from the group consisting of silica, titania, alumina, zirconia, vanadia, antimony oxide, tin oxide, and combinations thereof.

23. The method of claim 21, wherein the particles are present in the composition at less than about 65% by volume.

24. The method of claim 21, wherein the particles are present in the composition at between about 50% and about 80% by weight.

25. The method of claim 1 further comprising doping the structure with a doping agent.

26. The method of claim 25, wherein the doping agent is selected from the group consisting of metal salts, fluxing agent, dyes, sol-gel precursors, organometallic precursors, and combinations thereof.

27. The method of claim 26, wherein the fluxing agent comprises boron oxide, boric acid, borax, and sodium phosphate.

28. The method of claim 25, further comprising the step of sintering the structure for a time and temperature sufficient to achieve a substantially consolidated inorganic structure.

29. The method of claim 1, wherein the particles have an average particle size from about 1 nm to about 150 nm.

30. A method for making an inorganic structure comprising:
   (a) applying a photoreactive composition to a substrate, wherein the composition comprises:
       a reactive species,
       a photoinitiator system, and
       a plurality of substantially inorganic, colloidal surface-treated silica particles,
       wherein the particles have an average particle size of less than about 300 nm;
   (b) photopatterning the composition to define a structure; and
   (c) subjecting the structure to elevated temperature for a time sufficient to pyrolyze the reactive species and to at least partially fuse the particles.

31. The method of claim 30, wherein the particles have an average particle size from about 1 nm to about 150 nm.

32. The method of claim 30, wherein the particles are present in the composition at between about 50% and about 80% by weight.

33. The method of claim 30, wherein step (b) further comprises removing a soluble portion of the composition from the substrate.

34. The method of claim 30, wherein step (c) further comprises subjecting the structure to a temperature of between about 500° C. to about 1400° C. for about 2 hours to about 48 hours.

35. A planar optical device made according to the method of claim 7, wherein the device is subjected to an elevated temperature for a time sufficient to achieve a substantially inorganic porous structure.

36. A planar optical device made according to the method of claim 30, wherein the device is slowly heated to an elevated temperature between 500° C. and 1000° C. for a time sufficient to achieve a substantially inorganic porous structure.

37. An article comprising a plurality of substantially inorganic colloidal particles, wherein the particles have an average particle size of less than about 300 nm and are at least partially fused, and the article is a planar optical device capable of transmission of light through the device.

38. Article of claim 37, wherein the particles comprise silica.

39. Article device of claim 37, wherein the particles are surface treated.

40. Article of claim 37, wherein the particles are substantially consolidated.

41. Article of claim 37, wherein the particles have an average particle size of about 1 nm to about 150 nm.

42. The article of claim 37, wherein the device comprises a waveguide.

43. The article of claim 42, wherein the waveguide is photopatterned.

44. The article of claim 37, wherein the device comprises a sensor.

45. The article of claim 37, wherein the device comprises a splitter.

46. The article of claim 37, wherein the device comprises a coupler.

47. The article of claim 37, wherein the device comprises a ring resonator.

* * * * *